United States Patent
Kim

(10) Patent No.: US 9,051,636 B2
(45) Date of Patent: Jun. 9, 2015

(54) ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS

(71) Applicant: SAMSUNG DISPLAY CO., LTD., Yongin, Gyeonggi-Do (KR)

(72) Inventor: Dong-Wook Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 13/645,386

(22) Filed: Oct. 4, 2012

(65) Prior Publication Data

US 2013/0157016 A1    Jun. 20, 2013

(30) Foreign Application Priority Data

Dec. 16, 2011  (KR) .................. 10-2011-0136558

(51) Int. Cl.
| | | |
|---|---|---|
| B32B 3/30 | (2006.01) | |
| B05D 5/06 | (2006.01) | |

(Continued)

(52) U.S. Cl.
CPC ........ *C23C 14/042* (2013.01); *Y10T 428/24802* (2015.01); *Y10T 428/24612* (2015.01); *C23C 14/24* (2013.01); *H01L 21/67173* (2013.01); *H01L 21/67709* (2013.01); *H01L 21/6773* (2013.01); *H01L 21/6831* (2013.01);

(Continued)

(58) Field of Classification Search
None
See application file for complete search history.

(56) References Cited

U.S. PATENT DOCUMENTS

| 4,468,648 A | 8/1984 | Uchikune |
|---|---|---|
| 5,487,609 A | 1/1996 | Asada |

(Continued)

FOREIGN PATENT DOCUMENTS

| EP | 1 413 644 A2 | 4/2004 |
|---|---|---|
| EP | 1 418 250 A2 | 5/2004 |

(Continued)

OTHER PUBLICATIONS

European Search Report dated May 27, 2011, for European Patent application 10251514.5, 11 pages.

(Continued)

*Primary Examiner* — Joseph Miller, Jr.
(74) *Attorney, Agent, or Firm* — Christie, Parker & Hale, LLP

(57) ABSTRACT

An organic layer deposition apparatus including a deposition source for discharging a deposition material; a deposition source nozzle unit arranged at a side of the deposition source and including a plurality of deposition source nozzles; a patterning slit sheet arranged opposite to the deposition source nozzle unit and including a plurality of patterning slits; an electrostatic chuck, a substrate being attachable to and detachable from the electrostatic chuck; chuck moving members combined with the electrostatic chuck and configured to move the electrostatic chuck; and guide members to guide movement of the chuck moving members, the chuck moving members including first magnetic force generators, and the guide members including second magnetic force generators corresponding to the first magnetic force generators, the chuck moving members movable on the guide members by magnetic forces generated by the first magnetic force generators and the second magnetic force generators.

11 Claims, 15 Drawing Sheets

(51) Int. Cl.

| | | |
|---|---|---|
| *C23C 14/04* | (2006.01) | |
| *C23C 14/24* | (2006.01) | |
| *H01L 21/67* | (2006.01) | |
| *H01L 21/677* | (2006.01) | |
| *H01L 21/683* | (2006.01) | |
| *H01L 21/687* | (2006.01) | |
| *C23C 14/12* | (2006.01) | |
| *C23C 14/50* | (2006.01) | |

(52) U.S. Cl.
CPC .......... *H01L21/68764* (2013.01); *C23C 14/12* (2013.01); *C23C 14/50* (2013.01)

(56) References Cited

U.S. PATENT DOCUMENTS

| | | | |
|---|---|---|---|
| 5,909,995 | A | 6/1999 | Wolfe et al. |
| 6,274,198 | B1 | 8/2001 | Dautartas |
| 6,371,451 | B1 | 4/2002 | Choi |
| 6,749,906 | B2 | 6/2004 | Van Slyke |
| 6,995,035 | B2 | 2/2006 | Cok et al. |
| 7,964,037 | B2 | 6/2011 | Fukuda et al. |
| 2001/0006827 | A1 | 7/2001 | Yamazaki et al. |
| 2001/0021412 | A1* | 9/2001 | Watanabe et al. ............. 427/130 |
| 2002/0076847 | A1 | 6/2002 | Yamada et al. |
| 2002/0168577 | A1 | 11/2002 | Yoon |
| 2002/0194727 | A1 | 12/2002 | Cho et al. |
| 2003/0021658 | A1* | 1/2003 | Blonigan et al. ............. 414/217 |
| 2003/0101937 | A1 | 6/2003 | Van Slyke et al. |
| 2003/0168013 | A1 | 9/2003 | Freeman et al. |
| 2003/0221614 | A1 | 12/2003 | Kang et al. |
| 2003/0232563 | A1 | 12/2003 | Kamiyama et al. |
| 2004/0123804 | A1 | 7/2004 | Yamazaki et al. |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0194702 | A1 | 10/2004 | Sasaki et al. |
| 2005/0016461 | A1 | 1/2005 | Klug et al. |
| 2005/0031836 | A1 | 2/2005 | Hirai |
| 2005/0037136 | A1 | 2/2005 | Yamamoto |
| 2005/0166842 | A1 | 8/2005 | Sakamoto |
| 2005/0263074 | A1 | 12/2005 | Masuda et al. |
| 2006/0102078 | A1* | 5/2006 | Fairbairn et al. ............. 118/719 |
| 2006/0144325 | A1 | 7/2006 | Jung et al. |
| 2006/0164786 | A1 | 7/2006 | Kobayashi et al. |
| 2006/0174829 | A1 | 8/2006 | An et al. |
| 2006/0205101 | A1 | 9/2006 | Lee et al. |
| 2006/0255722 | A1 | 11/2006 | Imanishi |
| 2006/0278522 | A1 | 12/2006 | Kim et al. |
| 2007/0009652 | A1 | 1/2007 | Manz et al. |
| 2007/0046913 | A1 | 3/2007 | Shibazaki |
| 2007/0077358 | A1 | 4/2007 | Jeong et al. |
| 2007/0178708 | A1 | 8/2007 | Ukigaya |
| 2007/0275497 | A1 | 11/2007 | Kwack et al. |
| 2007/0297887 | A1 | 12/2007 | Tanaka |
| 2008/0018236 | A1 | 1/2008 | Arai et al. |
| 2008/0115729 | A1 | 5/2008 | Oda et al. |
| 2008/0131587 | A1 | 6/2008 | Boroson et al. |
| 2008/0216741 | A1 | 9/2008 | Ling et al. |
| 2008/0298947 | A1 | 12/2008 | Yeo et al. |
| 2009/0017192 | A1 | 1/2009 | Matsuura |
| 2009/0145752 | A1* | 6/2009 | Barnes et al. ............. 204/298.35 |
| 2009/0153033 | A1 | 6/2009 | Lee et al. |
| 2009/0229524 | A1 | 9/2009 | Kim et al. |
| 2009/0232976 | A1 | 9/2009 | Yoon et al. |
| 2010/0130020 | A1 | 5/2010 | Kim et al. |
| 2010/0156279 | A1 | 6/2010 | Tamura et al. |
| 2011/0052795 | A1* | 3/2011 | Choi et al. ...................... 427/69 |

FOREIGN PATENT DOCUMENTS

| | | |
|---|---|---|
| EP | 1 518 940 A1 | 3/2005 |
| JP | 04-272170 | 9/1992 |
| JP | 10-120171 | 5/1998 |
| JP | 2000-068054 | 3/2000 |
| JP | 2001-052862 | 2/2001 |
| JP | 2001-093667 | 4/2001 |
| JP | 2002-175878 | 6/2002 |
| JP | 2003-003250 | 1/2003 |
| JP | 2003-077662 | 3/2003 |
| JP | 2003-157973 | 5/2003 |
| JP | 2003-297562 | 10/2003 |
| JP | 2003-347394 | 12/2003 |
| JP | 2004-043898 | 2/2004 |
| JP | 2004-103269 | 4/2004 |
| JP | 2004-103341 | 4/2004 |
| JP | 2004-199919 | 7/2004 |
| JP | 2004-342455 | 12/2004 |
| JP | 2005-044592 | 2/2005 |
| JP | 2005-213616 | 8/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2006-307247 | 11/2006 |
| JP | 2007-047293 | 2/2007 |
| JP | 2008-019477 | 1/2008 |
| JP | 2008-121098 | 5/2008 |
| JP | 2009-019243 | 1/2009 |
| JP | 2009-87910 | 4/2009 |
| JP | 2009-117231 | 5/2009 |
| JP | 2010-159167 | 7/2010 |
| KR | 10-0151312 B1 | 6/1998 |
| KR | 10-0257219 B1 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0088662 A | 11/2002 |
| KR | 10-2002-0090934 | 12/2002 |
| KR | 10-2003-0043012 | 6/2003 |
| KR | 10-0405080 B1 | 11/2003 |
| KR | 10-0406059 | 11/2003 |
| KR | 10-2003-0091947 | 12/2003 |
| KR | 10-2003-0093959 | 12/2003 |
| KR | 10-2004-0034537 | 4/2004 |
| KR | 10-0430336 A1 | 5/2004 |
| KR | 10-2004-0050045 | 6/2004 |
| KR | 10-2004-0069281 | 8/2004 |
| KR | 10-2004-0084747 | 10/2004 |
| KR | 10-0463212 B1 | 12/2004 |
| KR | 10-2005-0024324 | 3/2005 |
| KR | 10-0520159 B1 | 10/2005 |
| KR | 10-2006-0008602 | 1/2006 |
| KR | 10-2006-0018745 | 3/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0646160 B1 | 11/2006 |
| KR | 10-0687007 B1 | 2/2007 |
| KR | 10-0696547 B1 | 3/2007 |
| KR | 10-0698033 B1 | 3/2007 |
| KR | 10-0700466 B1 | 3/2007 |
| KR | 10-2007-0035796 | 4/2007 |
| KR | 10-0711885 B1 | 4/2007 |
| KR | 10-2007-0050793 | 5/2007 |
| KR | 10-0723627 B1 | 5/2007 |
| KR | 10-2007-0056190 | 6/2007 |
| KR | 10-0726132 B1 | 6/2007 |
| KR | 10-0741142 B1 | 7/2007 |
| KR | 10-2007-0078713 | 8/2007 |
| KR | 10-2007-0080635 | 8/2007 |
| KR | 10-2007-0091437 | 9/2007 |
| KR | 10-2007-0101842 | 10/2007 |
| KR | 10-2007-0105595 | 10/2007 |
| KR | 10-0770653 B1 | 10/2007 |
| KR | 10-2008-0001184 | 1/2008 |

(56) References Cited

FOREIGN PATENT DOCUMENTS

| KR | 10-2008-0007896 | | 1/2008 |
|---|---|---|---|
| KR | 10-2008-0009285 | | 1/2008 |
| KR | 10-0797787 | B1 | 1/2008 |
| KR | 10-0800125 | | 1/2008 |
| KR | 10-0823508 | B1 | 4/2008 |
| KR | 10-2008-0044239 | A | 5/2008 |
| KR | 10-2008-0046761 | | 5/2008 |
| KR | 10-0827760 | B1 | 5/2008 |
| KR | 10-2008-0057159 | | 6/2008 |
| KR | 10-0839380 | B1 | 6/2008 |
| KR | 10-2008-0060400 | | 7/2008 |
| KR | 10-2008-0061132 | | 7/2008 |
| KR | 10-2008-0062212 | | 7/2008 |
| KR | 10-2008-0076574 | | 8/2008 |
| KR | 10-2008-0104479 | | 12/2008 |
| KR | 10-2008-0104695 | | 12/2008 |
| KR | 10-2009-0038733 | | 4/2009 |
| KR | 10-0899279 | B1 | 5/2009 |
| KR | 10-2009-0066996 | | 6/2009 |
| KR | 10-2009-0079765 | A | 7/2009 |
| KR | 10-2009-0081717 | | 7/2009 |
| KR | 10-2009-0094911 | | 9/2009 |
| KR | 10-2009-0097453 | | 9/2009 |
| KR | 10-2010-0038088 | | 4/2010 |
| KR | 10-2010-0044606 | | 4/2010 |
| KR | 10-2010-0128589 | | 12/2010 |
| KR | 10-1017654 | B | 2/2011 |
| WO | WO 03/043067 | A1 | 5/2003 |
| WO | WO 2004/016406 | | 2/2004 |

OTHER PUBLICATIONS

KIPO Office action dated Feb. 6, 2012, for Korean Patent application 10-2010-0011481, 7 pages.
KIPO Office action dated Feb. 6, 2012, for Korean Patent application 10-2010-0011480, 8 pages.
KIPO Office action dated Apr. 9, 2012, for Korean Patent application 10-2010-0031556, (4 pages).
KIPO Notice of Allowance dated Apr. 26, 2012, for Korean Patent application 10-2010-0066991, (5 pages).
U.S. Office action dated Jun. 21, 2011, for cross-reference U.S. Appl. 12/862,153, 21 pages.
KIPO Registration Determination Certificate dated Jul. 2, 2012, for Korean Patent application 10-2010-0011480, (5 pages).
KIPO Registration Determination Certificate dated Jul. 2, 2012, for Korean priority Patent application 10-2010-0011481, (5 pages).
U.S. Office action dated Oct. 3, 2012, for cross reference U.S. Appl. 12/869,830, (28 pages).
Patent Abstracts of Japan, and English machine translation of Japanese Publication 2001-052862, 20 pages.
Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2002, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 10-2007-0056241, dated Jun. 4, 2007, corresponding to Korean Patent 10-0741142 B1 listed above.
Korean Patent Abstracts, Publication No. 1020060126267, dated Dec. 6, 2006, for corresponding Korean Patent 10-0797787 listed above.
English Abstract, Publication No. 1020080002189, dated Jan. 4, 2008, for corresponding Korean Patent 10-0800125 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
Korean Patent Abstracts, Publication No. 10-2008-0070302, dated Jul. 30, 2008, corresponding to Korean Patent 10-0899279 B1 listed above.

* cited by examiner

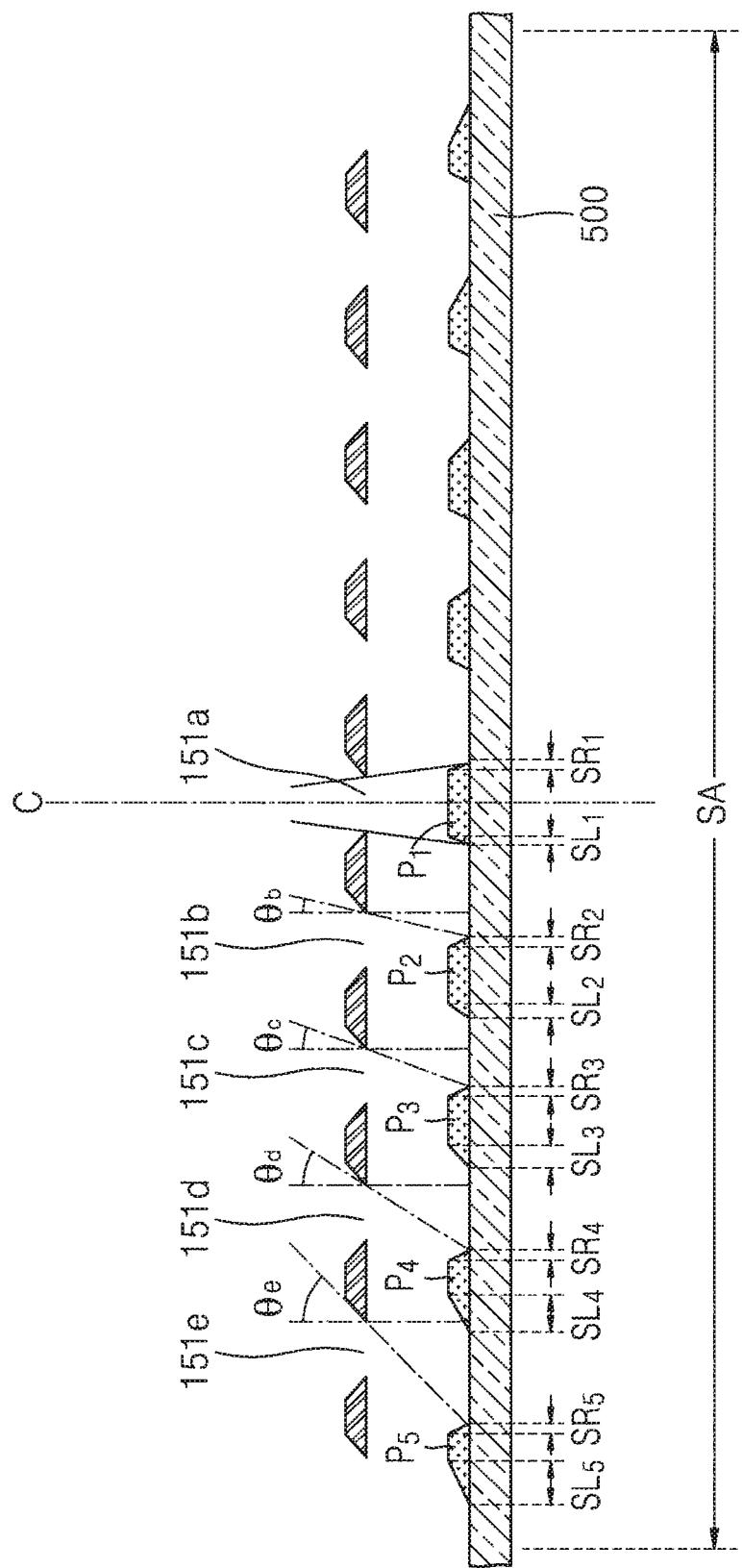

ORGANIC LAYER DEPOSITION APPARATUS, METHOD OF MANUFACTURING ORGANIC LIGHT-EMITTING DISPLAY APPARATUS USING THE SAME, AND ORGANIC LIGHT-EMITTING DISPLAY APPARATUS

CROSS-REFERENCE TO RELATED APPLICATION

This application claims priority to and the benefit of Korean Patent Application No. 10-2011-0136558, filed on Dec. 16, 2011 in the Korean Intellectual Property Office, the entire content of which is incorporated herein by reference.

BACKGROUND

1. Field

Aspects of embodiments of the present invention relate to an organic layer deposition apparatus, a method of manufacturing an organic light-emitting display apparatus by using the same, and an organic light-emitting display apparatus.

2. Description of the Related Art

An organic light-emitting display apparatus has a larger viewing angle, better contrast characteristics, and a faster response speed than other display apparatuses, and thus has drawn attention as a next-generation display apparatus.

In general, an organic light-emitting display apparatus has a stacked structure including an anode, a cathode, and an emission layer interposed between the anode and the cathode. The apparatus displays images in color when holes and electrons, injected respectively from the anode and the cathode, recombine in the emission layer and thus light is emitted. However, it is difficult to achieve high light-emission efficiency with such a structure. Thus, intermediate layers, including an electron injection layer, an electron transport layer, a hole transport layer, a hole injection layer, and/or the like, may be additionally interposed between the emission layer and each of the electrodes.

SUMMARY

According to aspects of embodiments of the present invention, an organic layer deposition apparatus is easily manufactured, may be simply applied to the manufacture of large-sized display devices on a mass scale, improves manufacturing yield and deposition efficiency, and has an improved precision of substrate transfer. According to further aspects of embodiments of the present invention, a method of manufacturing an organic light-emitting display device manufactured by using the organic layer deposition apparatus described above, and an organic light-emitting display device are provided.

According to an embodiment of the present invention, an organic layer deposition apparatus for forming an organic layer on a substrate includes a deposition source for discharging a deposition material; a deposition source nozzle unit arranged at a side of the deposition source and including a plurality of deposition source nozzles; a patterning slit sheet arranged opposite to the deposition source nozzle unit and including a plurality of patterning slits; an electrostatic chuck, the substrate being attachable to and detachable from the electrostatic chuck; chuck moving members combined with the electrostatic chuck and configured to move the electrostatic chuck; and guide members to guide movement of the chuck moving members. The chuck moving members include first magnetic force generators. The guide members include second magnetic force generators corresponding to the first magnetic force generators. The chuck moving members are movable on the guide members by magnetic forces generated by the first magnetic force generators and the second magnetic force generators. The substrate is spaced apart from the patterning slit sheet, and at least one of the substrate or the patterning slit sheet is movable relative to the other. The patterning slit sheet is smaller than the substrate in at least one of a first direction or a second direction perpendicular to the first direction.

Each of the first magnetic force generators may include a magnet rail including a plurality of magnets on a surface of one of the chuck moving members.

In the magnet rail, the magnets may be arranged in a line, and adjacent magnets of the plurality of magnets may have different polarities.

The plurality of magnets may include electromagnets, permanent magnets, or superconductive magnets.

Each of the second magnetic force generators may include a plurality of magnet rollers spaced apart from the magnet rail; a shaft connecting the plurality of magnet rollers; and a shaft fixing unit fixing the shaft onto the guide member to rotate the shaft about an axis extending along a lengthwise direction of the shaft.

The plurality of magnet rollers may include a plurality of magnets that are spirally twisted in the lengthwise direction of the shaft.

In the plurality of magnet rollers, adjacent magnets may have different polarities.

When the magnet rollers are rotated, a first electric field generated by the magnet rollers may be changed to move the chuck moving members each including the magnet rail on the guide members.

Each of the second magnetic force generators may further include a driving unit for rotating the shaft.

Each of the first magnetic force generators may include a plurality of magnet rollers; a shaft connecting the plurality of magnet rollers; and a shaft fixing unit fixing the shaft onto the guide member to rotate the shaft about an axis extending along a lengthwise direction of the shaft.

The plurality of magnet rollers may include a plurality of magnets that are spirally twisted in the lengthwise direction of the shaft.

In the plurality of magnet rollers, adjacent magnets may have different polarities.

Each of the second magnetic force generators may include a magnet rail including a plurality of magnets on a surface of the chuck moving member, the magnet rollers being spaced apart from the magnet rail.

In the magnet rail, the magnets may be arranged in a line, and adjacent magnets of the plurality of magnets may have different polarities.

The plurality of magnets may include electromagnets, permanent magnets, or superconductive magnets.

When the magnet rollers are rotated, a first electric field generated by the magnet rollers may change a second electric field, and the second electric field may be changed to move the chuck moving members each including the magnet rail on the guide members.

Each of the first magnetic force generators may further include a driving unit for rotating the shaft.

The driving unit may be on each of the chuck moving members, and moved together with the corresponding chuck moving member on the corresponding guide member.

The organic layer deposition apparatus may further include a linear motion (LM) guide between each of the chuck moving members and corresponding ones of the guide members.

Each of the LM guides may include guide blocks on respective ones of the chuck moving members; and guide rails on respective ones of the guide members, and the guide blocks may be movable on the guide rails.

The organic layer deposition apparatus may further include a loading unit for attaching the substrate to the electrostatic chuck; and an unloading unit for detaching the substrate on which deposition has been performed from the electrostatic chuck.

The patterning slit sheet may be smaller than the substrate.

The deposition source nozzle unit may include a plurality of deposition source nozzles arranged in a direction, and the plurality of patterning slits of the patterning slit sheet may be arranged in another direction perpendicular to the direction.

According to another embodiment of the present invention, an organic light-emitting display apparatus manufactured using the organic layer deposition apparatus includes the substrate; and at least one organic layer formed on the substrate by using the organic layer deposition apparatus. The at least one organic layer has a linear pattern.

The at least one organic layer may include an emission layer.

The at least one organic layer may include at least one layer selected from the group consisting of a hole injection layer, a hole transport layer, an electron transport layer, and an electron injection layer.

The at least one organic layer may have a non-uniform thickness.

According to another embodiment of the present invention, an organic light-emitting display apparatus includes at least one organic layer that has a non-uniform thickness and that is formed by using the organic layer deposition apparatus.

According to another embodiment of the present invention, a method of manufacturing an organic light-emitting display apparatus includes fixing a substrate onto an electrostatic chuck; combining the electrostatic chuck with chuck moving members; moving the electrostatic chuck into a chamber by moving the chuck moving members on guide members; and forming an organic layer on the substrate by moving at least one of the substrate or an organic layer deposition assembly arranged in the chamber relative to the other. The chuck moving members are moved on the guide members by magnetic forces, and the substrate is spaced apart from the organic layer deposition assembly. A patterning slit sheet of the organic layer deposition assembly is smaller than the substrate in at least one of a first direction or a second direction perpendicular to the first direction.

Each of the chuck moving members may include a first magnetic force generator on a surface thereof, and each of the guide members may include a second magnetic force generator on a surface thereof and corresponding to one of the first magnetic force generators.

Each of the first magnetic force generators may include a magnet rail including a plurality of magnets.

Each of the second magnetic force generators may include a plurality of magnet rollers spaced apart from the magnet rail; a shaft connecting the plurality of magnet rollers; and a shaft fixing unit fixing the shaft on the respective guide member to rotate the shaft about an axis extending along a lengthwise direction of the shaft.

Moving the electrostatic chuck may include generating a driving force to rotate the shaft by using a driving unit; and when the shaft is rotated, the magnet rollers are rotated to generate a first electric field, and the chuck moving members are moved on the guide members by a magnetic force between the first electric field and the magnet rail.

BRIEF DESCRIPTION OF THE DRAWINGS

The above and other features and aspects of the present invention will become more apparent by describing in detail some exemplary embodiments thereof with reference to the attached drawings in which:

FIG. 17 is a sectional side view illustrating an organic layer formed on a substrate by using the patterning slit sheet of FIG. 16, according to an embodiment of the present invention.

DETAILED DESCRIPTION

Hereinafter, some exemplary embodiments of the present invention are described in further detail with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

Figure 1:
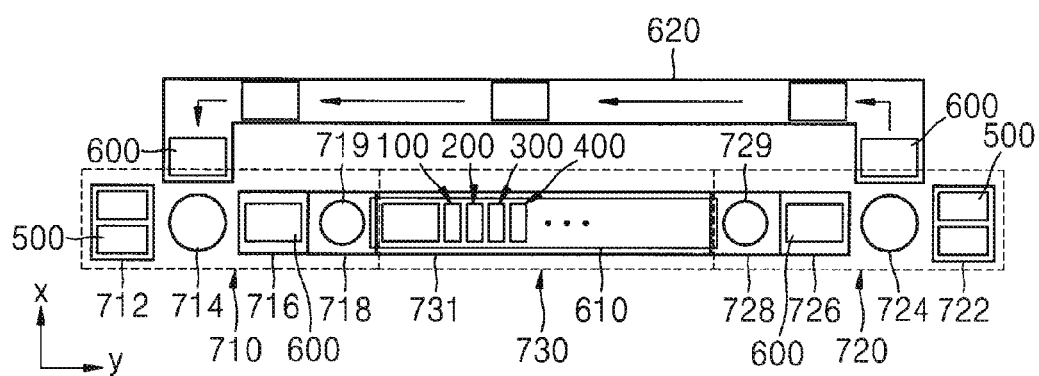
FIG. 1 is a schematic view of an organic layer deposition apparatus according to an embodiment of the present invention.

FIG. 1 is a schematic view of an organic layer deposition apparatus according to an embodiment of the present invention. Referring to FIG. 1, the organic layer deposition apparatus includes a loading unit 710, a deposition unit 730, an unloading unit 720, a first conveyer unit 610, and a second conveyer unit 620.

The loading unit 710, in one embodiment, may include a first rack 712, a transport robot 714, a transport chamber 716, and a first inversion chamber 718.

A plurality of substrates 500 on which a deposition material is not applied are stacked on the first rack 712. The transport robot 714 picks up one of the substrates 500 from the first rack 712, disposes it on an electrostatic chuck 600 transferred by the second conveyor unit 620, and moves the electrostatic chuck 600 having the substrate 500 thereon into the transport chamber 716.

The first inversion chamber 718 is disposed adjacent to the transport chamber 716. In one embodiment, a first inversion robot 719 disposed in the first inversion chamber 718 inverts the electrostatic chuck 600 having the substrate 500 thereon and then loads it onto the first conveyor unit 610 of the deposition unit 730.

Figure 2:
FIG. 2 is a schematic cross-sectional view of an electrostatic chuck of the organic layer deposition apparatus of FIG. 1 having a substrate attached thereto, according to an embodiment of the present invention.

Referring to FIG. 2, the electrostatic chuck 600, in one embodiment, may include an electrode 602 embedded in a main body 601 formed of ceramic, wherein the electrode 602 is supplied with power. The substrate 500 is attached to a surface of the main body 601 when high voltage is applied to the electrode 602.

Referring to FIG. 1, the transport robot 714 places one of the substrates 500 on an upper surface of the electrostatic chuck 600, and the electrostatic chuck 600 on which the substrate 500 is disposed is loaded into the transport chamber 716. The first inversion robot 719 inverts the electrostatic chuck 600 such that the substrate 500 is turned upside down in the deposition unit 730.

The unloading unit 720, in one embodiment, is constituted to operate in an opposite manner to the loading unit 710 described above. In one embodiment, a second inversion robot 729 in a second inversion chamber 728 inverts the electrostatic chuck 600 having the substrate 500 thereon, which has passed through the deposition unit 730, and then moves the electrostatic chuck 600 having the substrate 500 thereon into an ejection chamber 726. Then, an ejection robot 724 removes the electrostatic chuck 600 having the substrate 500 thereon from the ejection chamber 726, separates the substrate 500 from the electrostatic chuck 600, and then loads the substrate 500 onto a second rack 722. The electrostatic chuck 600 separated from the substrate 500 is returned to the loading unit 710 via the second conveyer unit 620.

However, the present invention is not limited to the above description. For example, in another embodiment, when the substrate 500 is initially disposed on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. Referring to FIG. 1, the deposition unit 730 may include a first chamber 731, in which first to fourth organic layer deposition assemblies 100, 200, 300, and 400 are disposed. Although FIG. 1 illustrates that a total of four organic layer deposition assemblies (i.e. the first to fourth organic layer deposition assemblies 100 to 400) are installed in the first chamber 731, a total number of organic layer deposition assemblies that may be installed in the first chamber 731 may be varied, such as according to a deposition material and deposition conditions. The first chamber 731 is maintained in a vacuum state during a deposition process.

In one embodiment, the electrostatic chuck 600 having the substrate 500 thereon may be moved at least to the deposition unit 730 or may be moved sequentially to the loading unit 710, the deposition unit 730, and the unloading unit 720 by the first conveyor unit 610. When the substrate 500 is separated from the electrostatic chuck 600 by the unloading unit 720, then the electrostatic chuck 600 is moved back to the loading unit 710 by the second conveyor unit 620.

Figure 3:
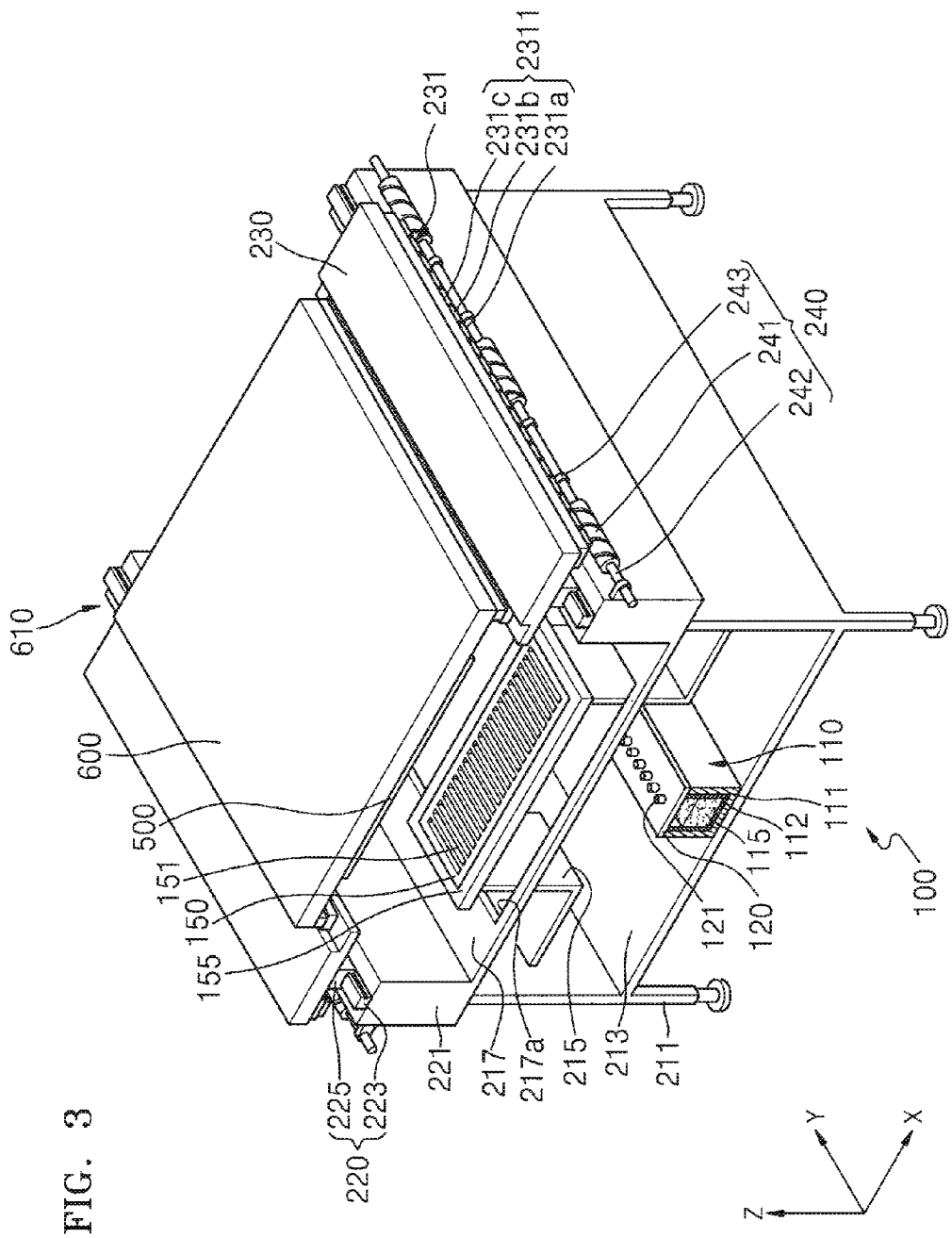
FIG. 3 is a perspective view of a first conveyor unit and a first organic layer deposition assembly included in the organic layer deposition apparatus of FIG. 1, according to an embodiment of the present invention.
Figure 4:
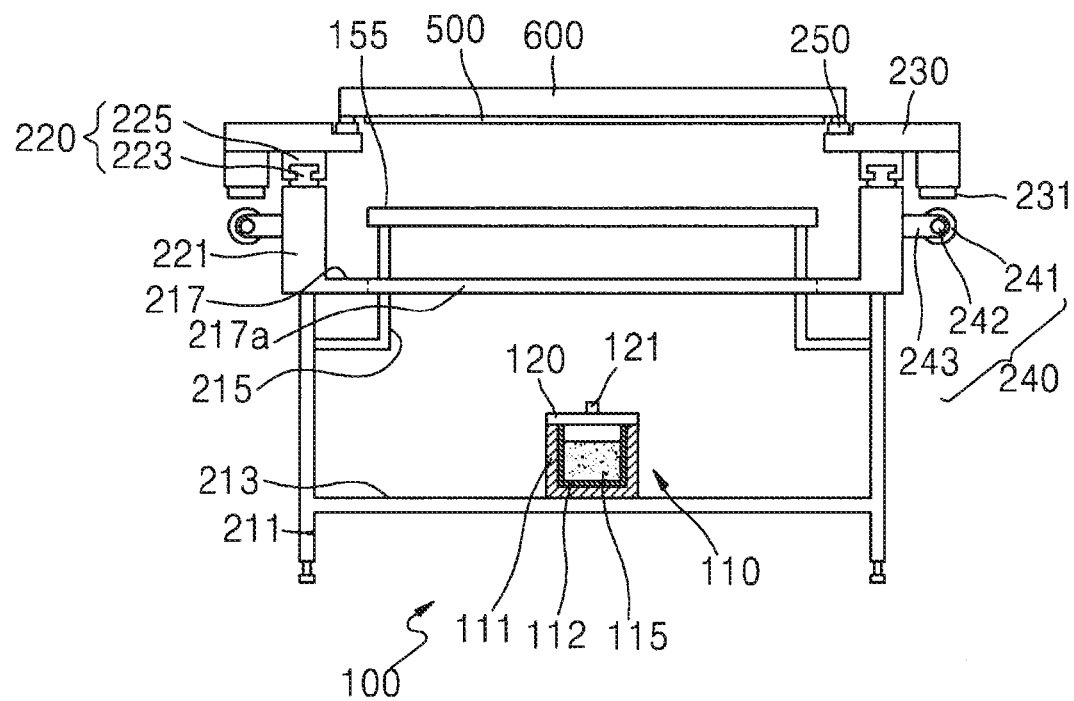
FIG. 4 is a front view of the first conveyor unit and the first organic layer deposition assembly of FIG. 3.
Figure 5:
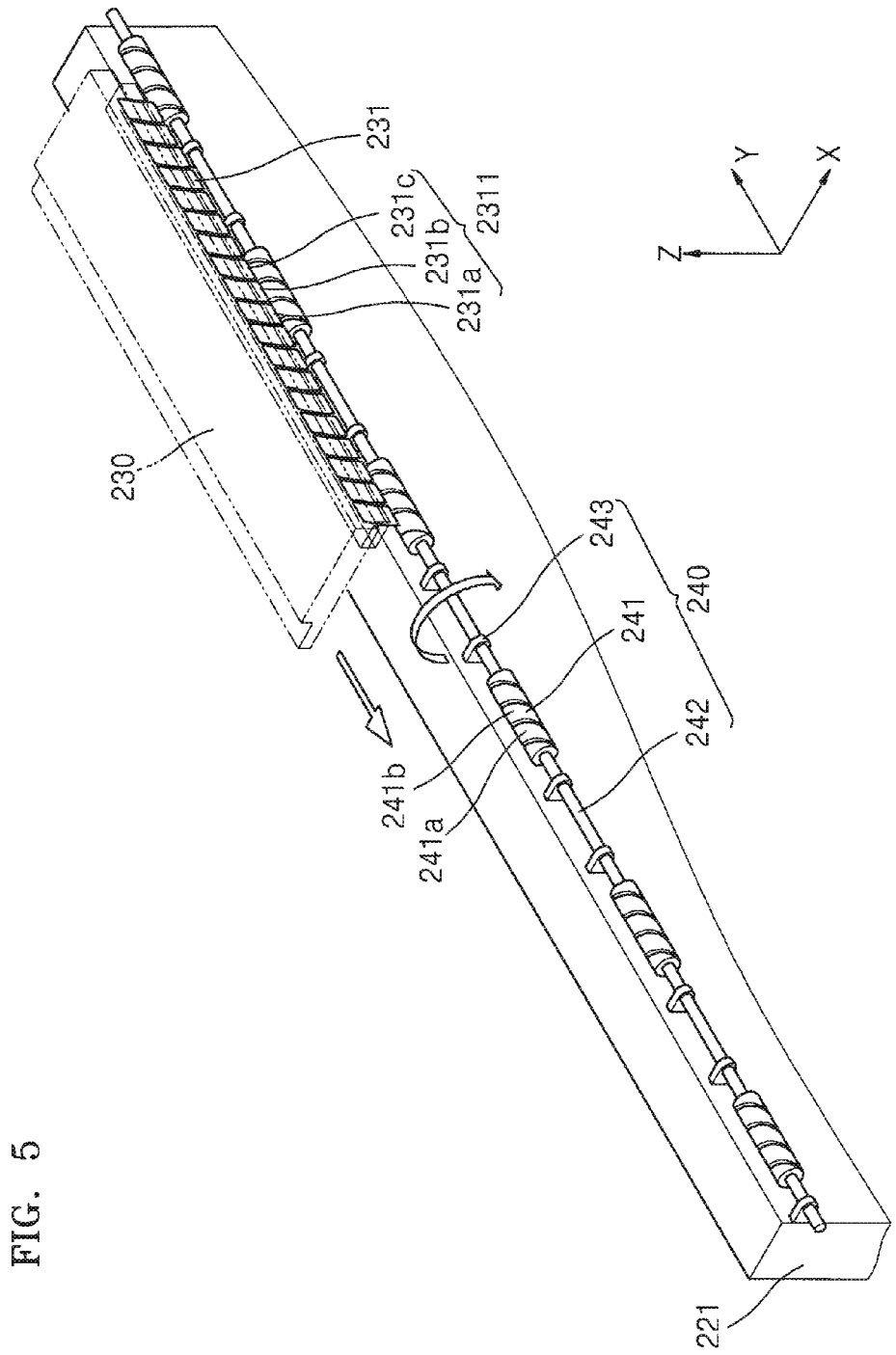
FIG. 5 is a perspective view of chuck moving members and guide members included in the organic layer deposition apparatus of FIG. 1, according to an embodiment of the present invention.

FIG. 3 is a perspective view of the first conveyor unit 610 and the first organic layer deposition assembly 100 included in the organic layer deposition apparatus of FIG. 1, according to an embodiment of the present invention. FIG. 4 is a front view of the first conveyor unit and the first organic layer deposition assembly of FIG. 3. For purposes of clarity, the first chamber 731 is not illustrated in FIG. 3. FIG. 5 is a perspective view of chuck moving members 230 and guide members 221 included in the organic layer deposition apparatus of FIG. 1, according to an embodiment of the present invention.

Referring to FIGS. 3 to 5, the organic layer deposition apparatus includes the first conveyor unit 610 and the first organic layer deposition assembly 100.

In one embodiment, the first organic layer deposition assembly 100 includes a deposition source 110, a deposition source nozzle unit 120, and a patterning slit sheet 150. The deposition source 110 includes a crucible 111 filled with a deposition material 115, and a heater 112 that heats the crucible 111 to vaporize the deposition material 115, which is contained in the crucible 111, toward the deposition source nozzle unit 120. The deposition source nozzle unit 120 is disposed at a side of the deposition source 110. The deposition source nozzle unit 120, in one embodiment, includes a plurality of deposition source nozzles 121 arranged in a direction (e.g., a Y-axis direction). The patterning slit sheet 150 and a frame 155 are further disposed between the deposition source 110 and the substrate 500. The patterning slit sheet 150 includes a plurality of patterning slits 151 arranged in a direction (e.g., an X-axis direction). In one embodiment, the deposition source 110, the deposition source nozzle unit 120, and the patterning slit sheet 150 may be formed as separate units in the deposition unit 730. This is described further later herein.

The first conveyor unit 610 will now be described in further detail.

The first conveyor unit 610 moves the electrostatic chuck 600 fixing the substrate 500 by using the chuck moving members 230. The first conveyor unit 610, in one embodiment, includes a frame 211, one or more sheet support units 215, the guide members 221, second magnetic force generators 240, linear motion (LM) guides 220, and the chuck moving members 230. The frame 211 includes a lower plate 213 and an upper plate 217. The seat support unit 215 is formed inside the frame 211. The guide members 221 are formed on the frame 211. The second magnetic force generators 240 are respectively located at sides of the guide members 221. Each of the LM guides 220 is disposed between one of the guide members 221 and one of the chuck moving members 230. Each of the chuck moving members 230 is combined with the electrostatic chuck 600, and includes one of first magnetic force generators 231 that are located to respectively correspond to the second magnetic force generators 240. The electrostatic chuck 600 and the chuck moving members 230 may be combined with or separated from one another via clamps 250. This is described in further detail below.

The frame 211 is used as a base of the first conveyor unit 610, and is formed having a generally hollow box shape. The lower plate 213 forms a lower surface of the frame 211, and the deposition source 110 may be disposed on the lower plate 213. The upper plate 217 forms an upper surface of the frame 211, and may have an aperture 217a through which the deposition material 115 vaporized in the deposition source 110 may pass through the patterning slit sheet 150 and then be deposited on the substrate 500. These elements of the frame 211 may be individually manufactured and then combined with one another, or may be manufactured integrally.

Although not shown, the lower plate 213 on which the deposition source 110 is disposed may be formed in a cassette shape such that the lower plate 213 may be detached from the frame 211. Thus, the deposition source 110 may be easily exchanged with another deposition source.

Each of the sheet support units 215 may protrude from an inner side surface of the frame 211 and support the patterning slit sheet 150. The sheet support units 215 may guide the deposition material 115, which is discharged through the plurality of deposition source nozzles 121, to move straight (e.g., not to flow in the X-axis direction). Although not shown, in another embodiment, the sheet support units may protrude from the inner side surfaces of the guide members 221 and support the patterning slit sheet 150.

The guide members 221, in one embodiment, are formed on the upper plate 217. The guide members 221 are installed to pass the substrate 500 through the first chamber 731 of the deposition unit 730. The guide members 221 are formed as a pair of guide members to be long in one direction (e.g., the Y-axis direction) and to be symmetrical to each other in one direction (e.g., the Y-axis direction). The guide members 221 provide a moving path of the chuck moving members 230.

Upper surfaces of the guide members 221, in one embodiment, are substantially planar surface, and the chuck moving members 230 are respectively disposed on the guide members 221. Each of the LM guides 220 may be disposed between one of the guide members 221 and one of the chuck moving members 230, and will be described further later herein.

In one embodiment, each of the second magnetic force generators 240 is disposed on an external side surface of one of the guide members 221. The first magnetic force generators 231 may be respectively disposed on the chuck moving members 230 to correspond to the second magnetic force generators 240. The chuck moving members 230 are moved on the guide members 221 due to magnetic forces generated by the first and second magnetic force generators 231 and 240.

Specifically, each of the first magnetic force generators 231 is disposed on a surface of one of the chuck moving members 230 to correspond to one of the second magnetic force generators 240. In each of the first magnetic force generators 231, a plurality of magnets 2311 are arranged in a line in the moving direction (e.g., the Y-axis direction) of the chuck moving members 230. In one embodiment, each of the magnets 2311 is arranged to have a polarity different from that of a magnet adjacent thereto. In one embodiment, if a magnet 231a of the magnets 2311 has an N-pole toward the corresponding second magnetic force generator 240, then a magnet 231b of the magnets 2311 that is adjacent to the magnet 231a has an S-pole toward the corresponding second magnetic force generator 240, and a magnet 231c of the magnets 2311 that is adjacent to the magnet 231b has an N-pole toward the corresponding second magnetic force generator 240. That is, in the first magnetic force generators 231, the magnets 231a, 231b, and 231c may be arranged in a line to have, for example, the N-pole, the S-pole, and the N-pole, respectively.

The magnets 2311 may be electromagnets, permanent magnets, or superconductive magnets.

In one embodiment, each of the second magnetic force generators 240 may include a plurality of magnet rollers 241, a shaft 242, and a shaft fixing unit 243.

Each of the magnet rollers 241, in one embodiment, includes a plurality of magnets 241a and 241b that are spirally twisted. The magnets 241a and 241b are twisted in the moving direction (e.g., the Y-axis direction) of the chuck moving members 230. In one embodiment, the adjacent magnets 241a and 241b have different polarities. That is, if the magnet 241a has an N-pole toward the outside, then the magnet 241b adjacent to the magnet 241a has an S-pole toward the outside.

The shaft 242 connects the plurality of magnet rollers 241. The plurality of magnet rollers 241 are disposed apart from one another in the moving direction (e.g., the Y-axis direction) of the chuck moving members 230. The shaft 242 connects the plurality of magnet rollers 241 arranged in the moving direction (e.g., the Y-axis direction) of the chuck moving members 230. The shaft 242 delivers a driving force generated by a driving unit (not shown) to the plurality of magnet rollers 241. In one embodiment, one end of the shaft 242 is connected to the driving unit, and the driving unit rotates the shaft 242 about an axis extending along a lengthwise direction (e.g., the Y-axis direction) of the shaft 242. The plurality of magnet rollers 241 connected to the shaft 242 are rotated together with the shaft 242 about the axis extending along the lengthwise direction (e.g., the Y-axis direction) of the shaft 242.

The shaft fixing unit 243 fixes the shaft 242 at a side of the corresponding guide member 221. The shaft fixing unit 243 has a pass-through hole (not shown), and the shaft 242 may pass through the pass-through hole and be rotated in the pass-through hole. The shaft fixing unit 243 may be combined with the shaft 242 exposed where the magnet rollers 241 are disposed apart from each other, and may be disposed on an external side surface of the corresponding guide member 221.

Each of the LM guides 220 may be disposed between one of the chuck moving members 230 and one of the guide members 221. In one embodiment, the LM guides 220 include a pair of guide rails 223 each disposed on a surface of one of the guide members 221, and a pair of guide blocks 225 each disposed on a surface of one of the chuck moving members 230. The guide blocks 225 are respectively inserted into the guide rails 223, and make a reciprocating movement on the guide rails 223.

A pair of LM rails may be used as the pair of guide rails 223, and a pair of LM blocks may be used as the pair of guide blocks 225, thereby forming an LM system. The LM system is a transfer system that offers very high positioning accuracy since it has a low friction coefficient and a low positioning error, compared to conventional sliding guide systems. In the present specification, a detailed description of the LM system is not provided.

An operation of the chuck moving members 230 moving on the guide members 221 will now be described in further detail with reference to FIG. 5.

The chuck moving members 230 are moved on the guide members 221 due to magnetic forces generated by the first magnetic force generators 231 and the second magnetic force generators 240. In one embodiment, each of the second magnetic force generators 240 is disposed on the external side surface of the corresponding guide member 221, and includes the plurality of magnet rollers 241 and the shaft 242 connecting the plurality of magnet rollers 241. The shaft 242 is connected to the driving unit, and delivers a rotational force generated by the driving unit to the plurality of magnet rollers 241. Thus, the magnet rollers 241 are rotated about an axis extending along the lengthwise direction (e.g., the Y-axis direction) of the shaft 242. The plurality of magnet rollers 241 include the magnets 241a and 241b that are spirally shaped as described above. An electric field is generated by the magnets 241a and 241b when the magnet rollers 241 are rotated, and then moves spirally. When the electric field moves, the chuck moving members 230 including the magnets 231a, 231b, and 231c are moved on the guide members 221.

Figure 6:
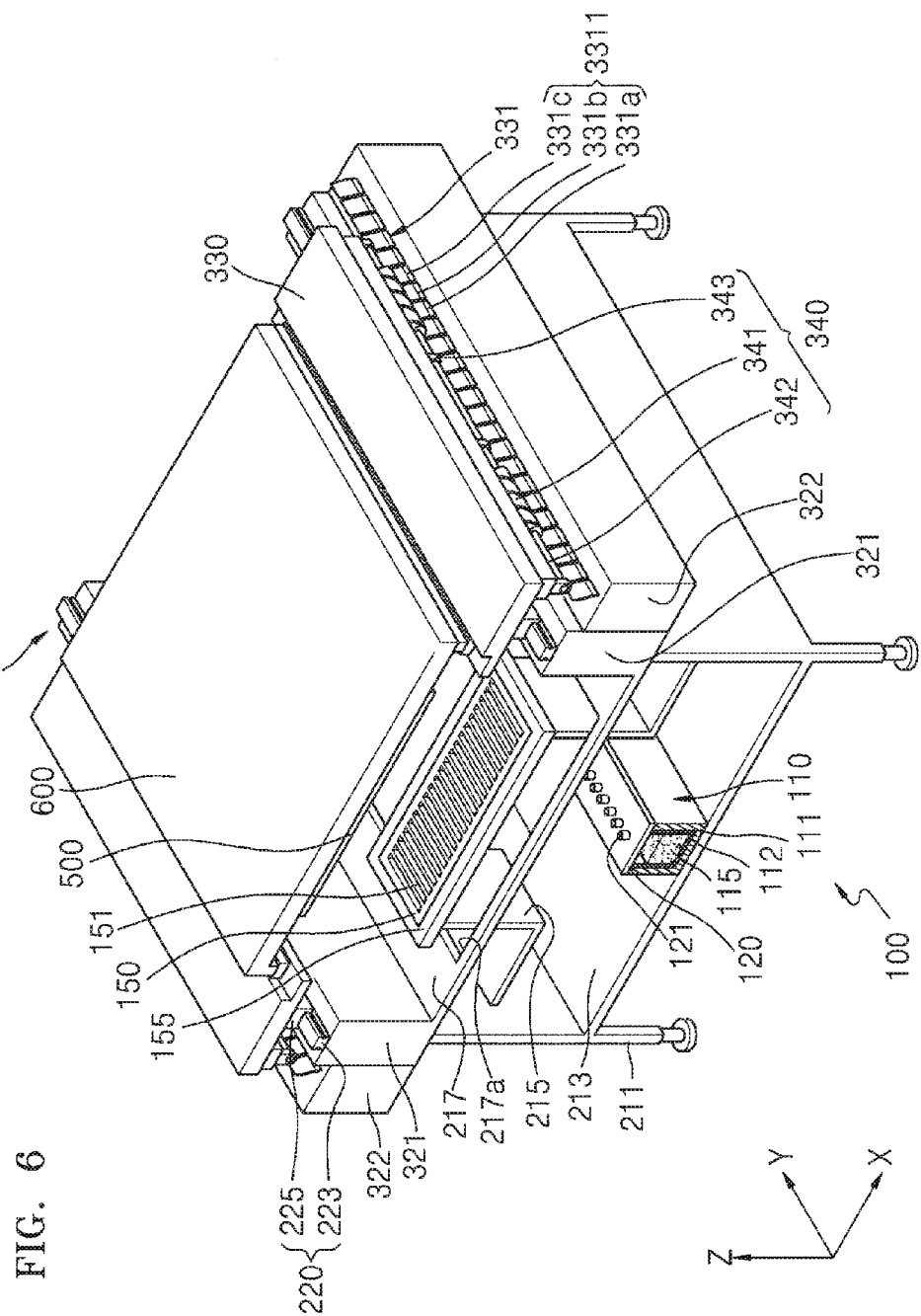
FIG. 6 is a perspective view of a first conveyor unit and a first organic layer deposition assembly included in an organic layer deposition apparatus, according to another embodiment of the present invention.
Figure 7:
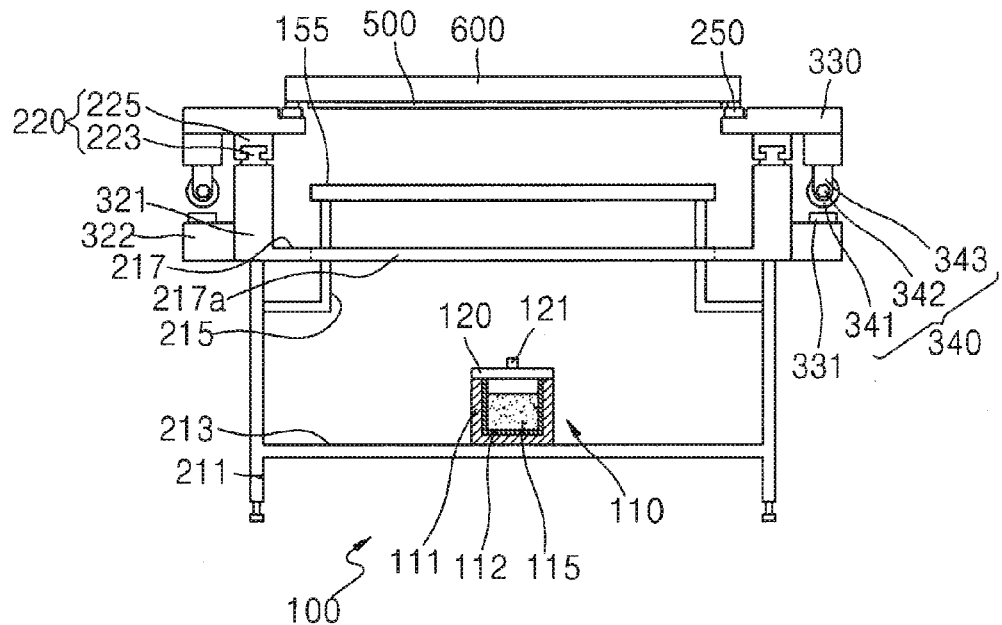
FIG. 7 is a front view of the first conveyor unit included in the organic layer deposition apparatus of FIG. 6.
Figure 8:
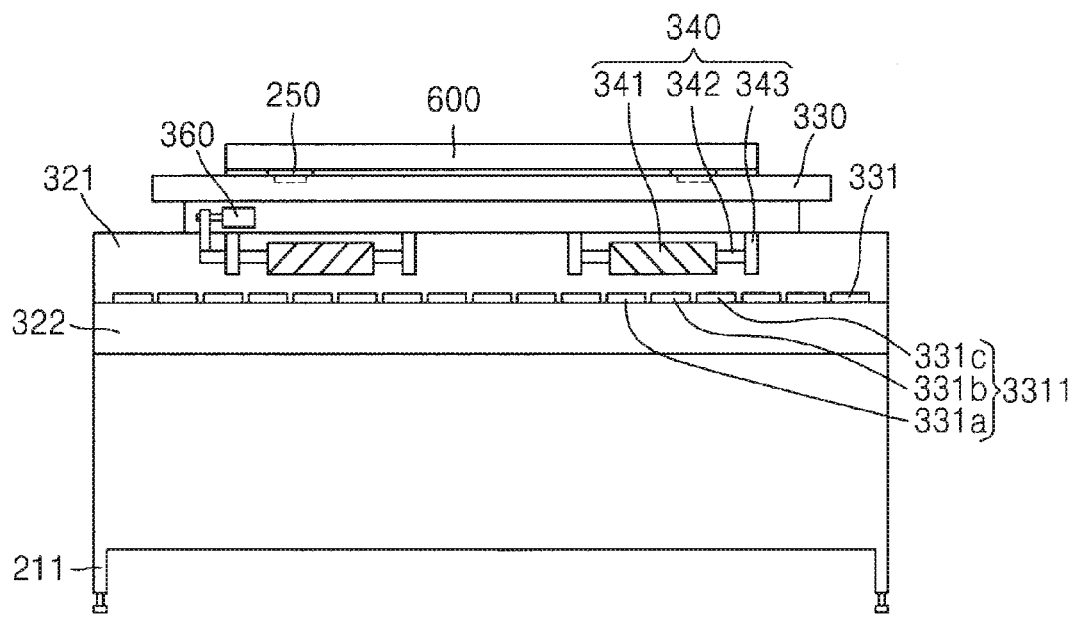
FIG. 8 is a side view of the first conveyor unit included in the organic layer deposition apparatus of FIG. 6.
Figure 9:
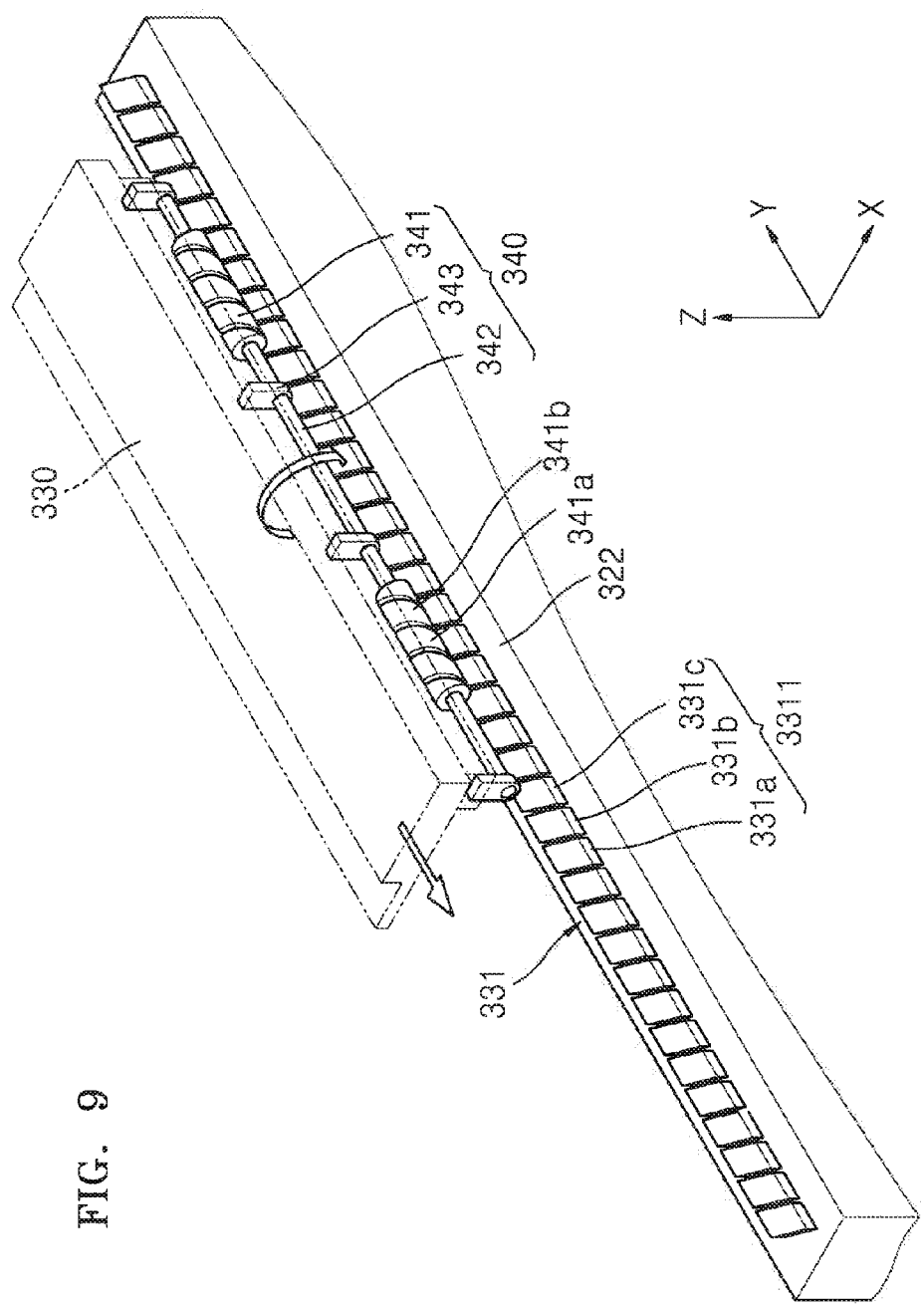
FIG. 9 is a perspective view of chuck moving members and guide members included in the organic layer deposition apparatus of FIG. 6, according to an embodiment of the present invention.

FIG. 6 is a perspective view of a first conveyor unit 610' and the first organic layer deposition assembly 100 included in an organic layer deposition apparatus, according to another embodiment of the present invention. FIG. 7 is a front view of the first conveyor unit 610' included in the organic layer deposition apparatus of FIG. 6. FIG. 8 is a side view of the first conveyor unit 610' included in the organic layer deposition apparatus of FIG. 6. FIG. 9 is a perspective view of chuck moving members 330 and guide members 322 included in the organic layer deposition apparatus of FIG. 6.

Referring to FIGS. 6 to 8, the organic layer deposition apparatus according to another embodiment of the present invention includes the first conveyor unit 610' and the first organic layer deposition assembly 100.

Referring to FIG. 6, the organic layer deposition assembly 100 includes the deposition source 110, the deposition source nozzle unit 120, and the patterning slit sheet assembly 150. These elements are as described above with reference to FIG. 3 and, therefore, further description will not be repeated.

The first conveyor unit 610' moves the electrostatic chuck 600 supporting the substrate 500 by using chuck moving members 330. The first conveyor unit 610', in one embodiment, includes the frame 211, one or more sheet support units 215, guide members 321, auxiliary guide members 322, second magnetic force generators 331, the LM guides 220, and the chuck moving members 330. The frame 211 includes the lower plate 213 and the upper plate 217. The sheet support unit 215 is formed inside the frame 211. The guide members 321 and the auxiliary guide members 322 are formed on the frame 211. The second magnetic force generators 331 are respectively located on the auxiliary guide members 322. Each of the LM guides 220 is disposed between one of the guide members 321 and one of the chuck moving members 330. Each of the chuck moving members 330 is combined with the electrostatic chuck 600, and includes one of first magnetic force generators 340 that are located to respectively correspond to the second magnetic force generators 331. This is described in further detail below.

The guide members 321, in one embodiment, may be formed on the upper plate 217, and the auxiliary guide members 322 may be respectively formed on external side surfaces of the guide members 321. The guide members 321 and the auxiliary guide members 322 are installed to pass the substrate 500 through the first chamber 731 of the deposition unit 730 of FIG. 1. The guide members 321 and the auxiliary guide members 322 are formed to be long in one direction (e.g., the Y-axis direction), and are symmetrical to each other in one direction (e.g., the Y-axis direction). The guide members 321 provide a moving path of the chuck moving members 330. The second magnetic force generators 331 may be respectively formed on the auxiliary guide members 322.

In one embodiment, upper surfaces of the guide members 321 are substantially planar surfaces, and the chuck moving members 330 are respectively disposed on the guide members 321. Each of the LM guides 220 may be disposed between one of the guide members 321 and one of the chuck moving members 330. This is described further later herein.

The auxiliary guide members 322 may be respectively disposed on the external side surfaces of the guide members 321. The guide members 321 and the auxiliary guide members 322 may be separately or integrally manufactured. Each of the second magnetic force generators 331 may be disposed on a surface of one of the auxiliary guide members 322 to correspond to the first magnetic force generators 340. Each of the first magnetic force generators 340 may be disposed on one of the chuck moving members 330 to correspond to one of the second magnetic force generators 331. The chuck moving members 330 are moved on the guide members 321 due to magnetic forces generated by the first and second magnetic force generators 340 and 331.

In one embodiment, each of the second magnetic force generators 331 is disposed on a surface of one of the auxiliary guide members 322 to correspond to one of the first magnetic force generators 340. In each of the second magnetic force generators 331, a plurality of magnets 3311 are arranged in a line in a moving direction (e.g., the Y-axis direction) of the chuck moving members 330. In one embodiment, each of the magnets 3311 is arranged to have a polarity different from that of a magnet adjacent thereto. In one embodiment, if a magnet 331a of the magnets 3311 has an N-pole toward the corresponding first magnetic force generator 340, then a magnet 331b of the magnets 3311 that is adjacent to the magnet 331a has an S-pole toward the corresponding first magnetic force generator 340, and a magnet 331c of the magnets 3311 that is adjacent to the magnet 331b has an N-pole toward the corresponding first magnetic force generator 340. That is, in the second magnetic force generators 331, the magnets 331a, 331b, and 331c may be arranged in a line to have, for example, the N-pole, the S-pole, and the N-pole, respectively.

The magnets 3311 may be electromagnets, permanent magnets, or superconductive magnets.

In one embodiment, each of the first magnetic force generators 340 may include a plurality of magnet rollers 341, a shaft 342, and a shaft fixing unit 343.

Each of the magnet rollers 341, in one embodiment, includes a plurality of magnets 341a and 341b that are spirally twisted. The magnets 341a and 341b are twisted in the moving direction (e.g., the Y-axis direction) of the chuck moving members 330. In one embodiment, the adjacent magnets 341a and 341b have different polarities. That is, if the magnet 341a has an N-pole toward the outside, then the magnet 341b adjacent to the magnet 341a has an S-pole toward the outside.

The shaft 342 connects the plurality of magnet rollers 341. The plurality of magnet rollers 341, in one embodiment, are disposed apart from one another in the moving direction (e.g., the Y-axis direction) of the chuck moving members 330. The shaft 342 connects the plurality of magnet rollers 341 arranged in the moving direction (e.g., the Y-axis direction) of the chuck moving members 330. The shaft 342 delivers a driving force generated by a driving unit 360 to the plurality of magnet rollers 341. In one embodiment, one end of the shaft 342 is connected to the driving unit 360, and the driving unit 360 rotates the shaft 342 about an axis extending along a lengthwise direction (e.g., the Y-axis direction) of the shaft 342. The plurality of magnet rollers 341 connected to the shaft 342 are rotated together with the shaft 342 about the axis extending along the lengthwise direction (e.g., the Y-axis direction) of the shaft 342.

The shaft fixing unit 343 fixes the shaft 342 at a side of the corresponding chuck moving member 330. The shaft fixing unit 343 has a pass-through hole (not shown), and the shaft 342 may pass through the pass-through hole and be rotated in the pass-through hole. The shaft fixing unit 343 may be combined with the shaft 342 that is exposed between adjacent magnet rollers 341 disposed apart from each other, and may be disposed on a surface (e.g., a lower surface) of the corresponding chuck moving member 330.

Each of the LM guides 220 may be disposed between one of the chuck moving members 330 and one of the guide members 321. The LM guides 220, in one embodiment, include a pair of guide rails 223 each disposed on one surface of one of the guide members 321, and a pair of guide blocks 225 each disposed on one surface of one of the chuck moving members 330. The guide blocks 225 are respectively inserted into the guide rails 223, and make a reciprocating movement on the guide rails 223. A pair of LM rails may be used as the pair of guide rails 223, and a pair of LM blocks may be used as the pair of guide blocks 225, thereby forming an LM system. The LM system is a transfer system that offers very high positioning accuracy since it has a low friction coefficient and a low positioning error, compared to conventional sliding guide systems. In the present specification, a detailed description of the LM system is not provided.

An operation of the chuck moving members 330 moving on the guide members 321 will now be described in further detail with reference to FIG. 9.

The chuck moving members 330 are moved on the guide members 321 due to magnetic forces generated by the first magnetic force generators 340 and the second magnetic force generators 331. In one embodiment, each of the first magnetic force generators 340 is disposed on one surface of the corresponding chuck moving member 330, and includes the plurality of magnet rollers 341, the shaft 342 connecting the plurality of magnet rollers 341, and the driving unit 360 that generates a rotational force. The shaft 342 is connected to the driving unit 360 and delivers the rotational force generated by the driving unit 360 to the plurality of magnet rollers 341. Thus, the magnet rollers 341 are rotated about an axis extending along the lengthwise direction (e.g., the Y-axis direction) of the shaft 342. An electric field is generated by the magnets 341a and 341b when the magnet rollers 341 are rotated, and then moves spirally. When the electric field moves, the chuck moving members 330 are moved on the guide members 321 and the auxiliary guide members 322 including the magnets 331a, 331b, and 331c.

In the organic layer deposition apparatus illustrated in FIGS. 6 to 9, the driving unit 360 is attached to the chuck moving members 330, and the chuck moving members 330 may thus be independently controlled. Furthermore, the plurality of magnets 331a, 331b, and 331c are arranged in a line on the auxiliary guide members 322, and thus, the chuck moving members 330 may be stably moved on the guide members 321.

Figure 10:
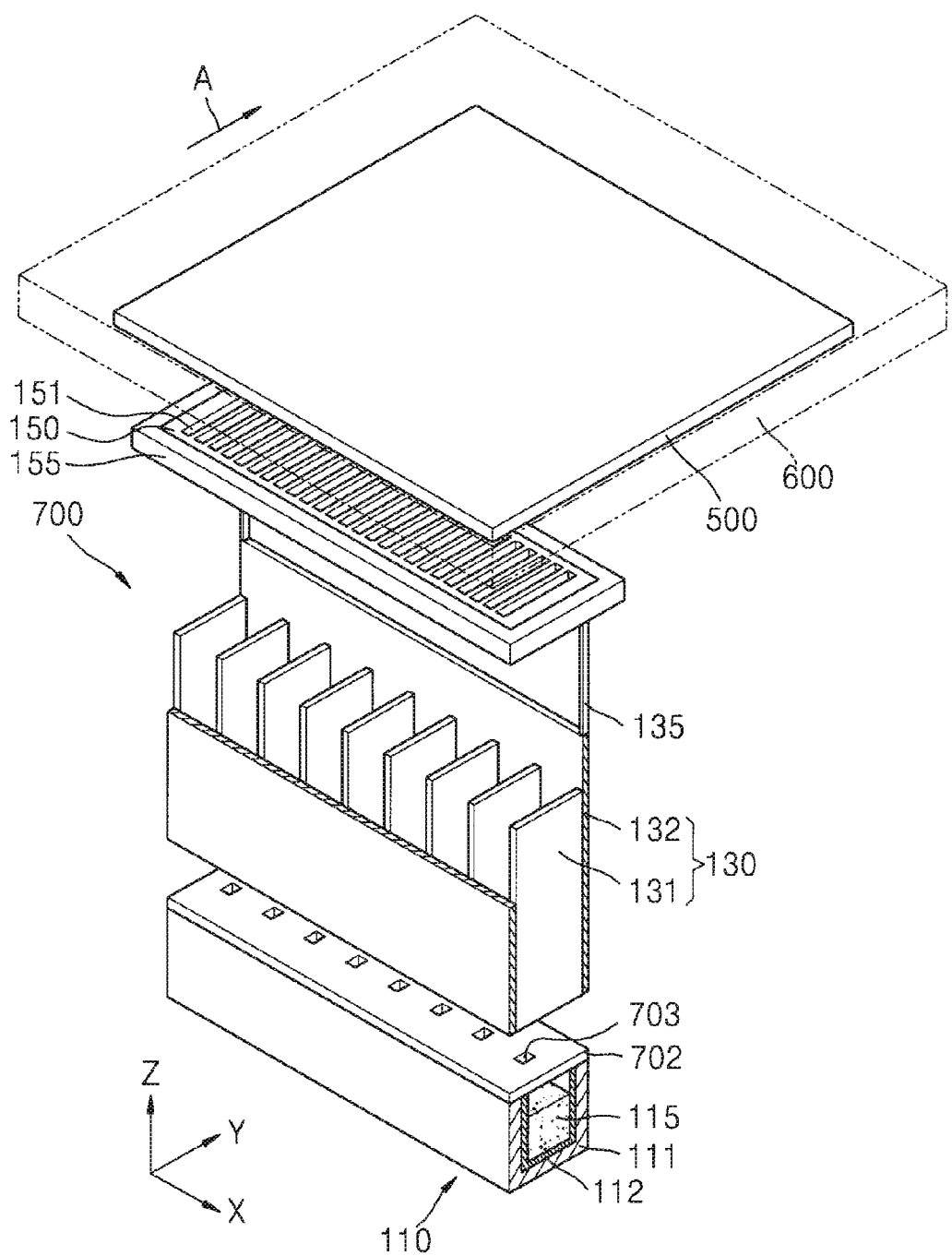
FIG. 10 is a schematic perspective view of an organic layer deposition assembly of the organic layer deposition apparatus of FIG. 1, according to an embodiment of the present invention.
Figure 11:
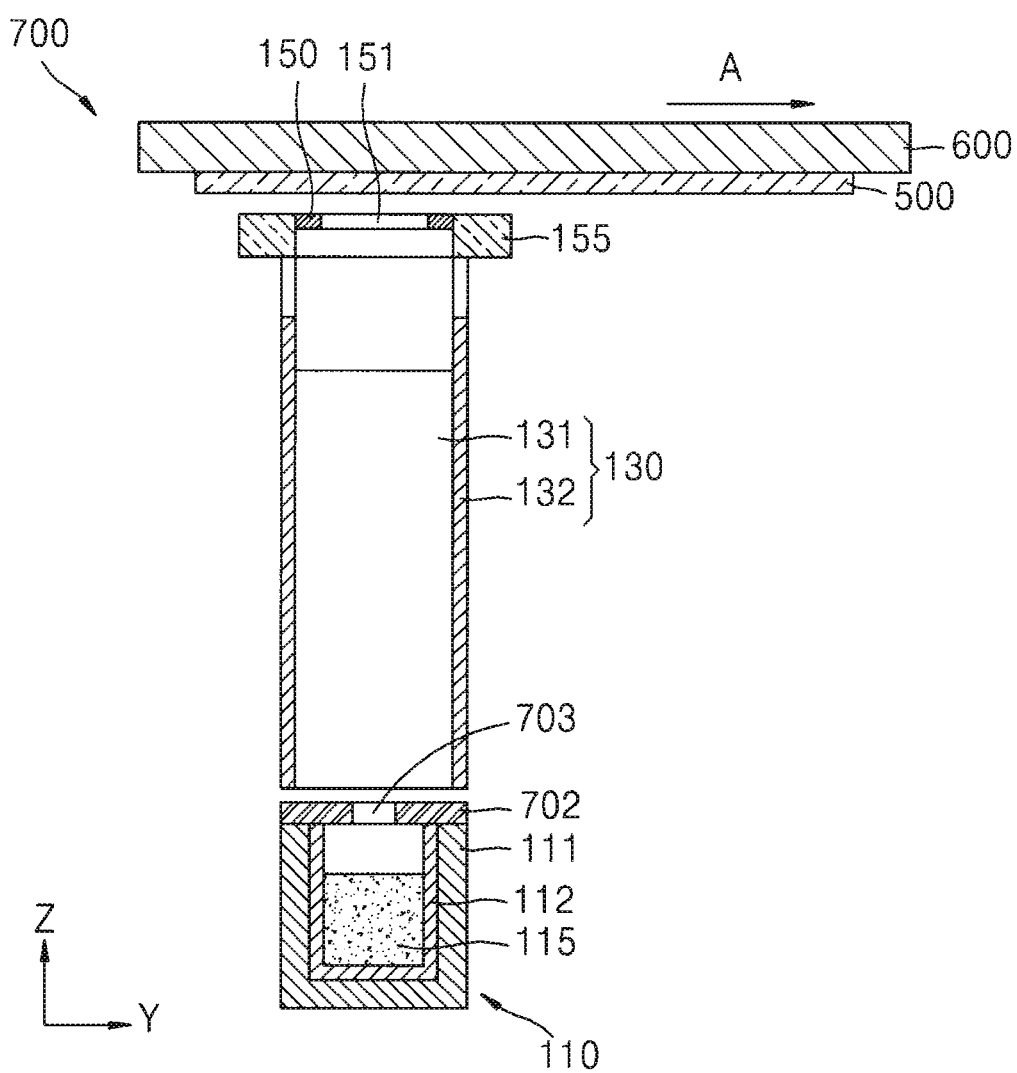
FIG. 11 is a schematic sectional side view of the organic layer deposition assembly of FIG. 10.
Figure 12:
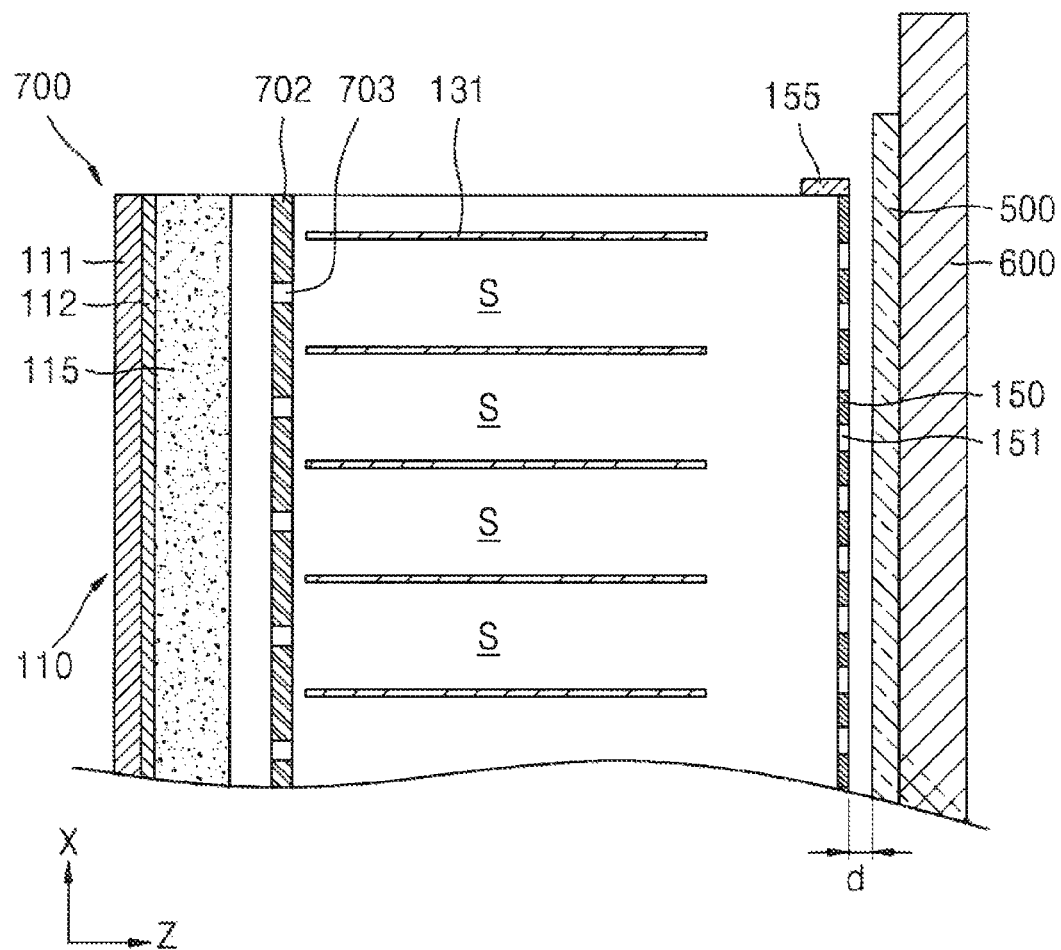
FIG. 12 is a schematic sectional plan view of the organic layer deposition assembly of FIG. 10.

Referring to FIGS. 10 to 12, an organic layer deposition assembly 700 of an organic layer deposition apparatus according to an embodiment of the present invention includes the deposition source 110, a deposition source nozzle unit 702, a barrier plate assembly 130, and the patterning slit sheet 150.

Although a chamber is not illustrated in FIGS. 10 through 12 for purposes of clarity, the components of the organic layer deposition assembly 700 may be disposed within a chamber that is maintained at an appropriate degree of vacuum. The chamber is maintained at an appropriate vacuum in order to allow the deposition material 115 to move in a substantially straight line through the organic layer deposition assembly 700.

In the chamber, the substrate 500 that is a deposition target substrate is transferred by the electrostatic chuck 600, such as shown in FIG. 1. The substrate 500 may be a substrate for flat panel displays. A large substrate, such as a mother glass, for manufacturing a plurality of flat panel displays, may be used as the substrate 500. However, other substrates may also be employed.

In one embodiment, the substrate 500 may be moved relative to the organic layer deposition assembly 700. For example, in one embodiment, as illustrated in FIG. 10, the substrate 500 may be moved in a direction of an arrow A, relative to the organic layer deposition assembly 700.

In a conventional deposition method using a fine metal mask (FMM), the size of the FMM has to be greater than or equal to a size of a substrate. Thus, the size of the FMM has to be increased as the substrate becomes larger. However, it is neither straightforward to manufacture a large FMM nor to extend an FMM to be accurately aligned with a fine pattern.

In order to overcome this problem, in the organic deposition assembly 700 according to an embodiment of the present invention, deposition may be performed while at least one of the organic layer deposition assembly 700 or the substrate 500 is moved relative to the other. In one embodiment, deposition may be continuously performed while the substrate 500, which is disposed to face the organic layer deposition assembly 100, is moved in a direction (e.g., the Y-axis direction). That is, deposition may be performed in a scanning manner while the substrate 500 is moved in the direction of the arrow A in FIG. 10. Although the substrate 500 is illustrated as being moved within the chamber (see the chamber 731 of FIG. 1) in the Y-axis direction when deposition is performed, aspects of embodiments of the present invention are not limited thereto. For example, in another embodiment, deposition may be performed while the organic layer deposition assembly 700 is moved in the Y-axis direction while the substrate 500 is fixed.

Thus, in the organic layer deposition assembly 700, the patterning slit sheet 150 may be significantly smaller than an FMM used in a conventional deposition method. In the organic layer deposition assembly 700, deposition may be continuously performed (i.e. in a scanning manner) while the substrate 500 is moved in the Y-axis direction. Thus, in one embodiment, a length of the patterning slit sheet 150 in the Y-axis direction may be significantly less than a length of the substrate 500 provided a width of the patterning slit sheet 150 in the X-axis direction and a width of the substrate 500 in the X-axis direction are substantially equal to each other. However, in another embodiment, even when the width of the patterning slit sheet 150 in the X-axis direction is less than the width of the substrate 500 in the X-axis direction, deposition may be performed on the entire substrate 500 in the scanning manner while the substrate 500 or the organic layer deposition assembly 700 is moved relative to the other.

As described above, since the patterning slit sheet 150 may be formed to be significantly smaller than the FMM used in the conventional deposition method, it is relatively easy to manufacture the patterning slit sheet 150. In other words, using the patterning slit sheet 150, which is smaller than the FMM used in the conventional deposition method, is more convenient in all processes, including etching and other subsequent processes, such as precise extension, welding, moving, and cleaning processes, compared to the conventional deposition method using the larger FMM. This is advantageous in manufacturing a relatively large display apparatus.

In order to perform deposition while the organic layer deposition assembly 700 or the substrate 500 is moved relative to the other as described above, the organic layer deposition assembly 700 and the substrate 500 may be separated from each other by a distance (e.g., a predetermined distance). This will be described further later herein.

The deposition source 110 that contains and heats the deposition material 115 is disposed in an opposite side of the chamber to a side in which the substrate 500 is disposed.

The deposition source 110 includes the crucible 111 filled with the deposition material 115, and the heater 112 that heats the crucible 111.

The deposition source nozzle unit 702 is disposed at a side of the deposition source 110, and in particular, at the side of the deposition source 110 facing the substrate 500. The deposition source nozzle unit 702, in one embodiment, includes a plurality of deposition source nozzles 703 that may be arranged at equal intervals in a direction (e.g., the X-axis direction). The deposition material 115 that is vaporized in the deposition source 110 passes through the deposition source nozzles 703 of the deposition source nozzle unit 702 towards the substrate 500 that is a deposition target substrate.

The barrier plate assembly 130 is disposed at a side of the deposition source nozzle unit 702. The barrier plate assembly 130, in one embodiment, includes a plurality of barrier plates 131, and a barrier plate frame 132 that covers sides of the barrier plates 131. The plurality of barrier plates 131, in one embodiment, may be arranged parallel to each other at equal intervals in the X-axis direction. Each of the barrier plates 131 may be arranged parallel to a Y-Z plane in FIG. 10, and may have a generally rectangular shape. The plurality of barrier plates 131 arranged as described above partitions a deposition space between the deposition source nozzle unit 702 and the patterning slit sheet 150 into a plurality of sub-deposition spaces S. In the organic layer deposition assembly 700, as illustrated in FIG. 12, the deposition space is divided by the barrier plates 131 into the sub-deposition spaces S that respectively correspond to the deposition source nozzles 703 through which the deposition material 115 is discharged.

The barrier plates 131 may be respectively disposed between adjacent deposition source nozzles 703. In other words, each of the deposition source nozzles 703 may be disposed between two adjacent barrier plates 131. The deposition source nozzles 703, in one embodiment, may be respectively located at respective midpoints between two adjacent barrier plates 131. However, the present invention is not limited to this structure. For example, in another embodiment, a plurality of deposition source nozzles 703 may be disposed between two adjacent barrier plates 131. In this case, the plurality of deposition source nozzles 703 may be also respectively located at the midpoint between two adjacent barrier plates 131.

Since the barrier plates 131 partition the deposition space between the deposition source nozzle unit 702 and the patterning slit sheet 150 into the plurality of sub-deposition spaces S as described above, the deposition material 115 discharged through each of the deposition source nozzles 703 is not mixed with the deposition material 115 discharged through the other deposition source nozzles 703, and passes through the plurality of patterning slits 151 so as to be deposited on the substrate 500. In other words, the barrier plates 131 guide the deposition material 115, which is discharged through the deposition source nozzles 703, to move straight, and not to flow in the X-axis direction.

As described above, the deposition material 115 is forced to move straight by installing the barrier plates 131, such that a shadow zone formed on the substrate 500 is reduced compared to a case in which no barrier plates are installed. Thus, the organic layer deposition assembly 700 and the substrate 500 may be separated from each other by a distance (e.g., a predetermined distance), as will be described further later herein.

The patterning slit sheet 150 and the frame 155 are disposed between the deposition source 110 and the substrate 500. The shape of the frame 155 may be similar to a window frame. The patterning slit sheet 150 is bound inside the frame 155. The patterning slit sheet 150 includes the plurality of patterning slits 151 arranged in the X-axis direction. The patterning slits 151 extend in the Y-axis direction. The deposition material 115 that has been vaporized in the deposition source 110 and passed through the deposition source nozzle 703, passes through the patterning slits 151 towards the substrate 500.

The patterning slit sheet 150, in one embodiment, may be formed of a metal thin film and fixed onto the frame 150 such that a tensile force is exerted thereon. The patterning slits 151 may be formed by etching the patterning slit sheet 150 to a stripe pattern. The number of patterning slits 151 may be equal to the number of deposition patterns to be formed on the substrate 500.

The barrier plate assembly 130 and the patterning slit sheet 150 may be disposed to be separated from each other by a predetermined distance. Alternatively, the barrier plate assembly 130 and the patterning slit sheet 150 may be connected by connection members 135.

As described above, the organic layer deposition assembly 700 according to an embodiment of the present invention performs deposition while being moved relative to the substrate 500. In order to move the organic layer deposition assembly 700 relative to the substrate 500, the patterning slit sheet 150 is separated from the substrate 500 by a distance d (e.g., a predetermined distance) (see FIG. 12). In addition, in order to prevent or substantially prevent formation of a relatively large shadow zone on the substrate 500 when the patterning slit sheet 150 and the substrate 500 are disposed apart from each other, the barrier plates 131 are arranged between the deposition source nozzle unit 702 and the patterning slit sheet 150 to force the deposition material 115 to move in a straight direction. Thus, the size of the shadow zone that may be formed on the substrate 500 may be substantially reduced.

In a conventional deposition method using a FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of a mask has to be increased as display apparatuses become larger. However, it is not easy to manufacture such a large mask.

In order to overcome this problem, in the organic layer deposition assembly 700 according to an embodiment of the present invention, the patterning slit sheet 150 is disposed to be separated from the substrate 500 by the distance d (e.g., a predetermined distance). This may be facilitated by installing the barrier plates 131 to reduce the size of a shadow zone to be formed on the substrate 500.

As described above, according to an embodiment of the present invention, a mask is formed to be smaller than a substrate, and deposition is performed while the mask is moved relative to the substrate. Thus, the mask can be easily manufactured. In addition, defects caused due to the contact between a substrate and a mask, which occur in the conventional deposition method, may be prevented or substantially prevented. Furthermore, since it is unnecessary to dispose the mask in close contact with the substrate during a deposition process, the manufacturing time may be reduced.

In one embodiment, the deposition source 110, the deposition source nozzle unit 702, and the patterning slit sheet 150 included in the organic layer deposition assembly 700 are not integrally formed but are separately included in the deposition unit 730 of FIG. 1. Accordingly, the deposition source 110 may be easily attached to and detached from the organic layer deposition assembly 700 so as to fill the deposition source 110 with the deposition material 115, to cleanse the patterning slit sheet 150, or to exchange the patterning slit sheet 150 with another patterning slit sheet.

Figure 13:
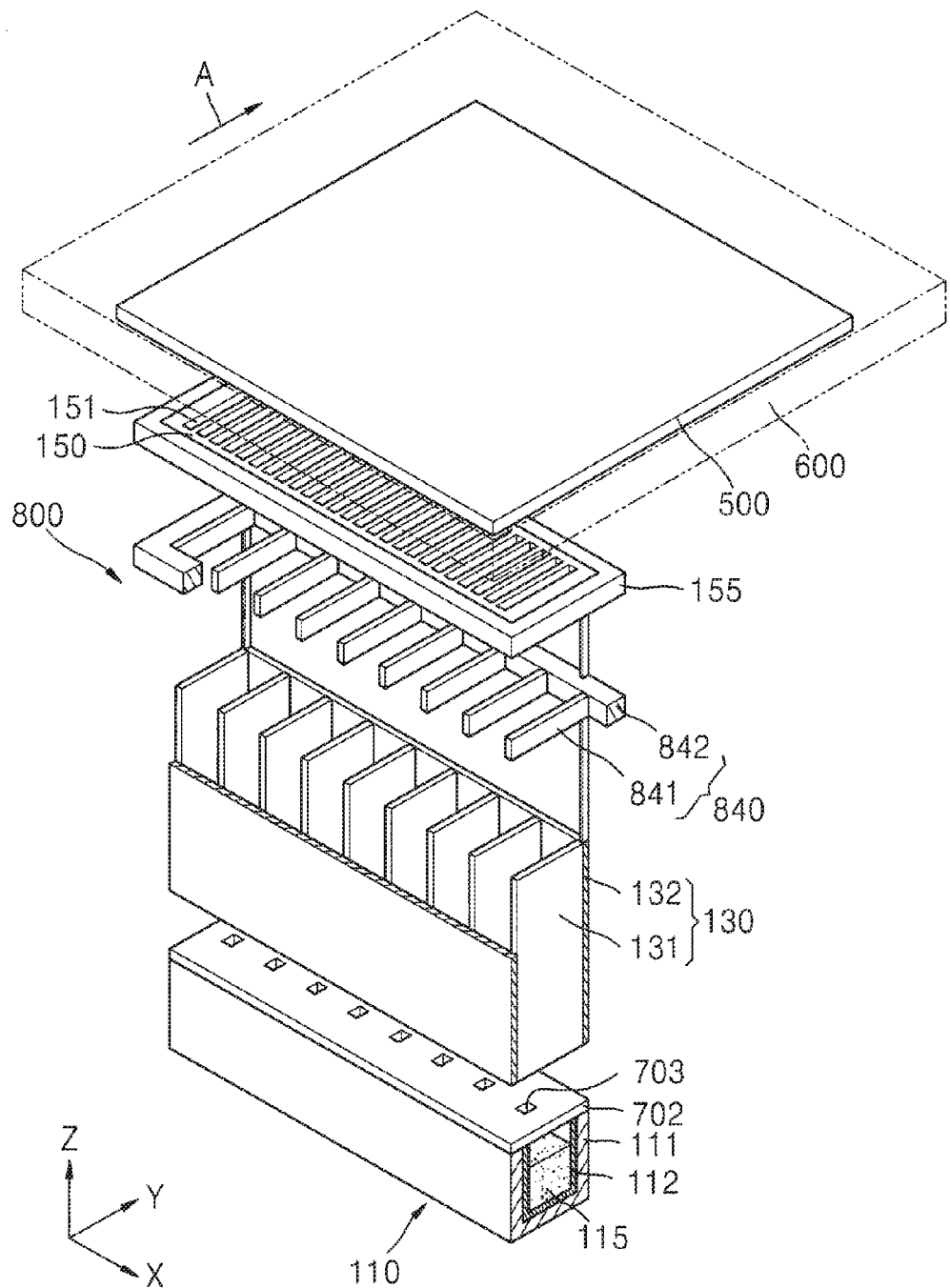
FIG. 13 is a schematic perspective view of an organic layer deposition assembly according to another embodiment of the present invention.

FIG. 13 is a schematic perspective view of an organic layer deposition assembly 800 according to another embodiment of the present invention. Referring to FIG. 13, the organic layer deposition assembly 800 includes the deposition source 110, the deposition source nozzle unit 702, the first barrier plate assembly 130, a second barrier plate assembly 840, and the patterning slit sheet 150. In one embodiment, the deposition source 110, the first barrier plate assembly 130, and the patterning slit sheet 150 have the same or similar structures as those described above with reference to FIG. 10, and thus, further description thereof will not be repeated. The organic layer deposition assembly 800 differs from the organic layer deposition assembly 700 described above with respect to FIG. 10 in that the second barrier plate assembly 840 is disposed at a side of the first barrier plate assembly 130.

In one embodiment, the second barrier plate assembly 840 includes a plurality of second barrier plates 841, and a second barrier plate frame 842 that covers sides of the plurality of second barrier plates 841. The plurality of second barrier plates 841, in one embodiment, may be arranged parallel to each other at equal intervals in the X-axis direction. In addition, each of the plurality of second barrier plates 841 may be formed to extend in a Y-Z plane in FIG. 13 (i.e. perpendicular to the X-axis direction).

The plurality of first barrier plates 131 and the plurality of second barrier plates 841 arranged as described above partition a deposition space between the deposition source nozzle unit 702 and the patterning slit sheet 150. The deposition space is divided by the plurality of first barrier plates 131 and the plurality of second barrier plates 841 into sub-deposition spaces that respectively correspond to the deposition source nozzles 703 through which a deposition material 115 is discharged.

The plurality of second barrier plates 841 may be disposed to respectively correspond to the plurality of first barrier plates 131. In other words, the plurality of second barrier plates 841 may be aligned with respect to the plurality of first barrier plates 131, respectively. That is, each pair of the corresponding first and second barrier plates 131 and 841 may be located on the same plane. The plurality of first barrier plates 131 and the plurality of second barrier plates 841 are respectively illustrated as having a substantially same thickness in the X-axis direction, but aspects of embodiments of the present invention are not limited thereto. In one embodiment, the second barrier plates 841, which are precisely aligned with the patterning slits 151, may be formed to be relatively thin, whereas the first barrier plates 831, which do not need to be precisely aligned with the patterning slits 151, may be formed to be relatively thick. This makes it easier to manufacture the organic layer deposition assembly 800.

Figure 14:
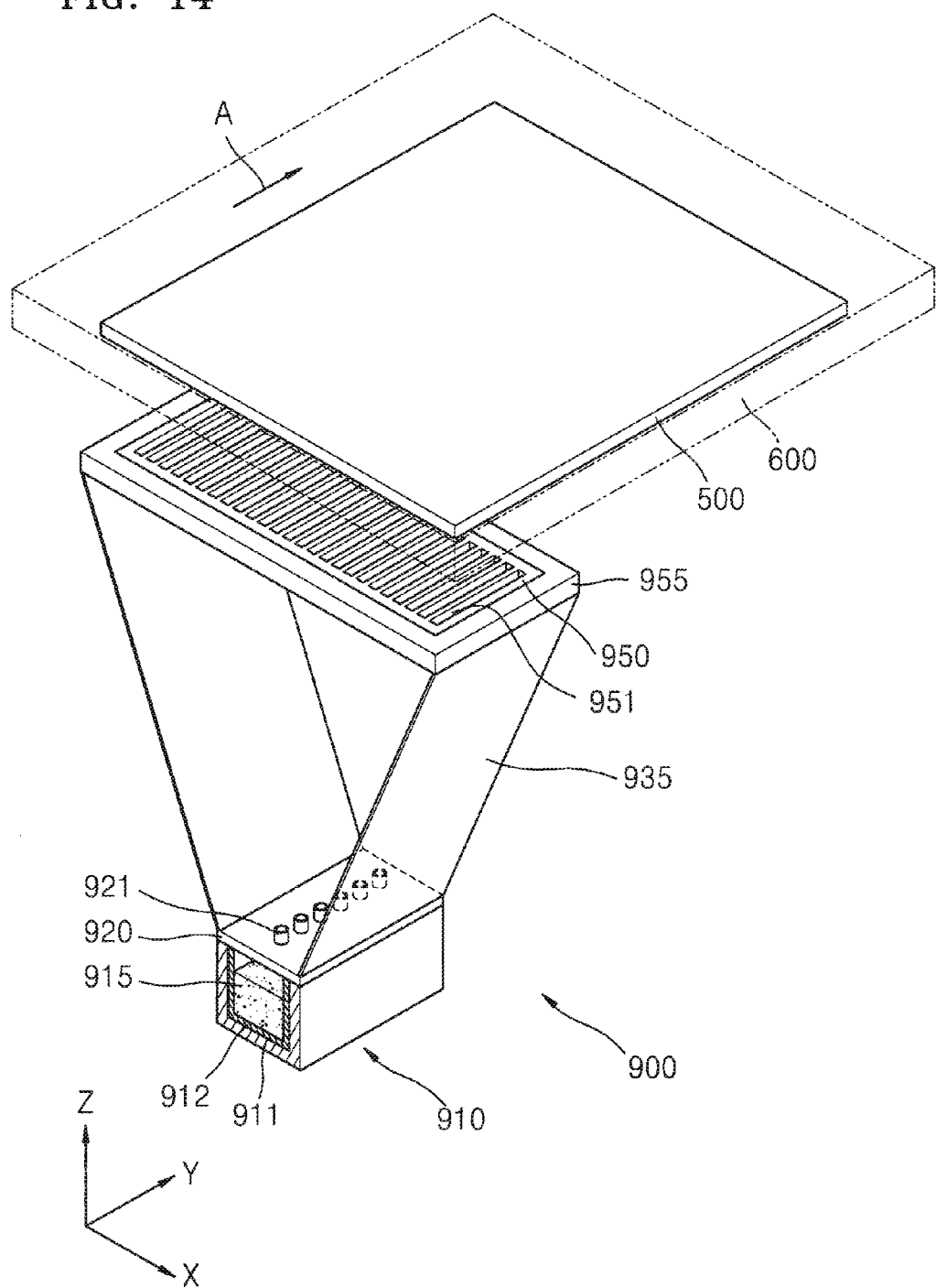
FIG. 14 is a schematic perspective view of an organic layer deposition assembly according to another embodiment of the present invention.

FIG. 14 is a schematic perspective view of an organic layer deposition assembly 900 according to another embodiment of the present invention. Referring to FIG. 14, the organic layer deposition assembly 900 includes a deposition source 910, a deposition source nozzle unit 920, and a patterning slit sheet 950.

The deposition source 910 includes a crucible 911 that is filled with a deposition material 915, and a heater 912 that heats the crucible 911 to vaporize the deposition material 915, which is contained in the crucible 911, toward the deposition source nozzle unit 920. The deposition source nozzle unit 920 is disposed at a side of the deposition source 910. The deposition source nozzle unit 920 includes a plurality of deposition source nozzles 921 arranged in a direction (e.g., the Y-axis direction). The patterning slit sheet 950 and a frame 955 are further disposed between the deposition source 910 and the substrate 500. The patterning slit sheet 950 includes a plurality of patterning slits 951 that are arranged in a direction (e.g., the X-axis direction). In one embodiment, the deposition source 910 and the deposition source nozzle unit 920 may be connected to the patterning slit sheet 950 by connection members 935.

The organic layer deposition assembly 900 differs from the previously described embodiments in terms of the arrangement of the plurality of deposition source nozzles 921 included in the deposition source nozzle unit 920. This is described in further detail below.

The deposition source nozzle unit 920 is disposed at a side of the deposition source 910, and in particular, at the side of the deposition source 910 facing the substrate 500. The deposition source nozzle unit 920, in one embodiment, includes the plurality of deposition source nozzles 921 that may be arranged at equal intervals in the Y-axis direction (i.e. a scanning direction of the substrate 500). The deposition material 915 that is vaporized in the deposition source 910, passes through the deposition source nozzle unit 920 towards the substrate 500 that is a deposition target substrate. As described above, when the deposition source nozzle unit 920 includes the plurality of deposition source nozzles 921 arranged in the Y-axis direction, that is, the scanning direction of the substrate 500, the size of a pattern formed of the deposition material 915 discharged through each of a plurality of patterning slits 951 of the patterning slit sheet 950 is affected by the size of one of the deposition source nozzles 921 since there is only one line of the deposition source nozzles 921 in the X-axis direction. Thus, a shadow zone may be prevented or substantially prevented from forming on the substrate 500. In addition, since the plurality of deposition source nozzles 921 are arranged in the scanning direction of the substrate 500, even if there is a difference in flux between the deposition source nozzles 921, the difference may be compensated for and deposition uniformity may be maintained constant. Furthermore, the organic layer deposition assembly 900 does not include a barrier plate assembly, such as that shown in FIG. 10, thereby improving utility efficiency of the deposition material 915.

Figure 15:
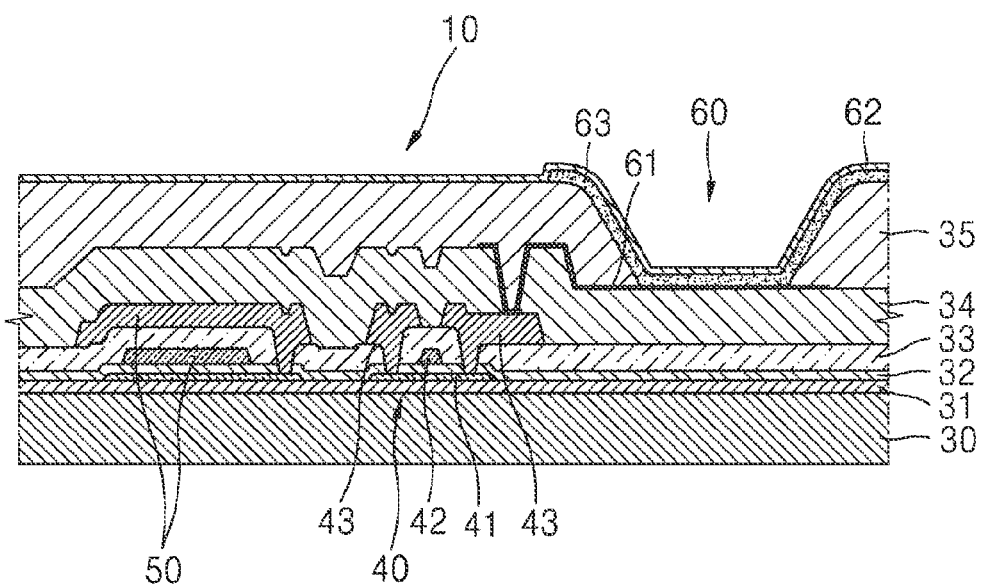
FIG. 15 is a cross-sectional view of an active matrix organic light-emitting display apparatus manufactured using an organic layer deposition apparatus, according to an embodiment of the present invention.

FIG. 15 is a cross-sectional view of an active matrix organic light-emitting display apparatus 10 manufactured by using an organic layer deposition apparatus, according to an embodiment of the present invention. Referring to FIG. 15, the active matrix organic light-emitting display apparatus 10 is formed on a substrate 30 which may be, for example, the substrate 500 of FIG. 1. The substrate 30 may be formed of a transparent material, such as glass, plastic, or metal, for example. In one embodiment, an insulating layer 31, such as a buffer layer, is formed on an entire surface of the substrate 30.

Referring to FIG. 15, a thin film transistor (TFT) 40, a capacitor 50, and an organic light-emitting diode (OLED) 60 are disposed on the insulating layer 31.

In one embodiment, a semiconductor active layer 41 is formed in a predetermined pattern on the insulating layer 31, and a gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. In one embodiment, the gate insulating layer 32 and the interlayer insulating layer 33 are etched (e.g., by dry etching) to form a contact hole for exposing parts of the semiconductor active layer 41.

A source/drain electrode 43 is formed on the interlayer insulating layer 33 to contact the semiconductor active layer 41 exposed through the contact hole. In one embodiment, a passivation layer 34 is formed to cover the source/drain electrode 43, and is etched to expose a part of the drain electrode 43. An additional insulating layer (not shown) may be further formed on the passivation layer 34 so as to planarize the passivation layer 34.

The OLED 60 displays image information (e.g., predetermined image information) by emitting red, green, or blue light as current flows therethrough. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening is formed in the pixel defining layer 35, and an organic layer 63 including an emission layer (not shown) is formed in a region defined by the opening. A second electrode 62 is formed on the organic layer 63.

The pixel defining layer 35, which defines individual pixels, is formed of an organic material. The pixel defining layer 35 planarizes the surface of a region of the substrate 30 in which the first electrode 61 is formed, and, in particular, the surface of the passivation layer 34.

The first electrode 61 and the second electrode 62 are insulated from each other, and respectively apply voltages of opposite polarities to the organic layer 63 including the emission layer to induce light emission.

The organic layer 63 may be formed of a low-molecular weight organic material or a high-molecular weight organic material. If the low-molecular weight organic material is used, then the organic layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

After the organic layer 63 is formed, the second electrode 62 may be formed according to the same deposition method used to form the organic layer 63.

The first electrode 61 may function as an anode, and the second electrode 62 may function as a cathode, or vice versa. The first electrode 61 may be patterned to correspond to individual pixel regions, and the second electrode 62 may be formed to cover all the pixels.

The first electrode 61 may be formed as a transparent electrode or a reflective electrode. The transparent electrode may be formed of an indium tin oxide (ITO), an indium zinc oxide (IZO), a zinc oxide (ZnO), or an indium oxide ($In_2O_3$), for example. The reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and then forming a transparent electrode layer of an ITO, an IZO, a ZnO, or an $In_2O_3$ on the reflective layer, for example. The first electrode 61 may be formed by forming a layer (e.g., by sputtering), and then patterning the layer (e.g., by photolithography).

The second electrode 62 may also be formed as a transparent electrode or a reflective electrode. When the second electrode 62 is formed as a transparent electrode, the second electrode 62 functions as a cathode. The transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63, and forming an auxiliary electrode layer or a bus electrode line thereon from ITO, IZO, ZnO, $In_2O_3$, or the like. When the second electrode 62 is formed as a reflective electrode, a reflective layer may be formed by depositing Li, Ca, LiF/Ca, LiF/Al, Al, Ag, Mg, or a compound thereof on the organic layer 63. The second electrode 62 may be formed according to the same deposition method used to form the organic layer 63.

The organic layer deposition apparatuses according to the above-described embodiments of the present invention may be applied to form an organic or inorganic layer of an organic TFT, and to form layers from various materials.

Figure 16:
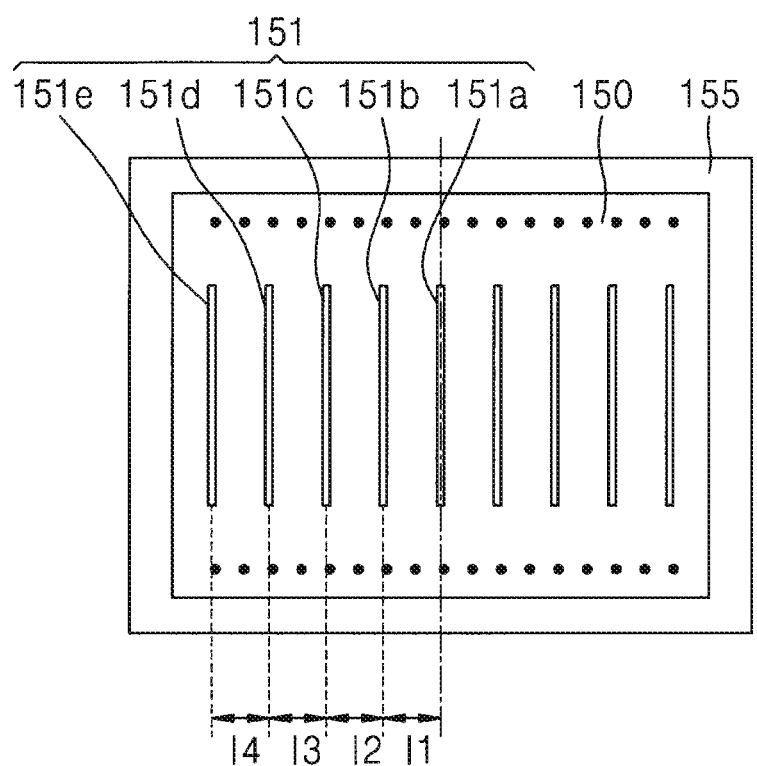
FIG. 16 is a top view showing patterning slits formed at equal intervals in a patterning slit sheet of an organic layer deposition assembly, according to an embodiment of the present invention.

FIG. 16 is a top view showing the patterning slits 151 formed at equal intervals in the patterning slit sheet 150 of an organic layer deposition assembly, according to an embodiment of the present invention. FIG. 17 is a sectional side view illustrating an organic layer formed on the substrate 500 by using the patterning slit sheet 150 of FIG. 16, according to an embodiment of the present invention.

Referring to FIGS. 16 and 17, the patterning slits 151 are arranged at equal intervals in the patterning slit sheet 150. That is, referring to FIG. 16, the relation of $I_1=I_2=I_3=I_4$ is established.

In this case, a deposition material that passes along a centerline C of a sub-deposition space SA has an incident angle substantially perpendicular to the substrate 500. Thus, an organic layer $P_1$ formed of the deposition material passing through a patterning slit 151a may have the smallest entire shadow zone including a right-side shadow zone $SR_2$ and a left-side shadow zone $SL_1$ that are symmetrical to each other.

However, the deposition material passing through a patterning slit far away from the centerline C of the sub-deposition space SA may have a greater critical incident angle θ, and thus, the deposition material passing through a patterning slit 151e disposed at an end region of the substrate 500 may, in one embodiment, have a critical incident angle $θ_e$ of about 55°. Thus, the deposition material enters the patterning slit 151e slanting at an angle, and thus forms an organic layer $P_5$ by passing through the patterning slit 151e, wherein the organic layer $P_5$ has the largest entire shadow zone in which a left-side shadow zone $SL_5$ is wider than a right-side shadow zone $SR_5$.

In other words, the greater the critical incident angle θ of the deposition material, the larger the entire shadow zone of an organic layer, and, in particular, the larger a side shadow zone of the organic layer farther away from the centerline C of the sub-deposition space SA. In addition, the critical incident angle θ of the deposition material becomes greater at a greater distance from the centerline C of the sub-deposition space SA to the corresponding patterning slit. Thus, the greater the distance from the centerline C of the sub-deposition space SA to a patterning slit, the larger the entire shadow zone of an organic layer formed of the deposition material that has passed through the patterning slit, and the larger a side shadow zone of the organic layer farther away from the centerline C of the sub-deposition space SA than a side shadow zone at a side nearer to the centerline C.

In other words, referring to FIG. 17, for organic layers formed on the left side of the centerline C of the sub-deposition space SA, left-inclined sides thereof are wider than right-inclined sides thereof. On the contrary, for organic layers formed on the right side of the centerline C of the sub-deposition space SA, right-inclined sides thereof are wider than left-inclined sides thereof.

In addition, among the organic layers formed on the left side from the center line C of the sub-deposition space SA, organic layers lying further left from the centerline C have wider left-inclined sides than right-inclined ones compared to the other organic layers. Similarly, among the organic layers formed on the right side from the centerline C of the sub-deposition space SA, organic layers lying further right from the centerline C have wider right-inclined sides than left-inclined ones compared to the other organic layers. Further, the organic layers formed in the sub-deposition space SA are symmetrical with respect to the centerline C of the sub-deposition space SA.

The deposition material passes through a patterning slit 151b at a critical incident angle $\theta_b$ to form an organic layer $P_2$ including a left-side shadow zone having a width of $SL_2$ and a right-side shadow zone having a width of $SR_2$. Similarly, the deposition material passes through a patterning slit 151c at a critical incident angle $\theta_c$ to form an organic layer $P_3$ including a left-side shadow zone having a width of $SL_3$ and a right-side shadow zone having a width of $SR_3$. Similarly, the deposition material passes through a patterning slit 151d at a critical incident angle $\theta_d$ to form an organic layer $P_4$ including a left-side shadow zone having a width of $SL_4$ and a right-side shadow zone having a width of $SR_4$. The deposition material passes through the patterning slit 151e at the critical incident angle $\theta_e$ to form the organic layer $P_5$ including the left-side shadow zone having a width of $SL_5$.

Herein, the relation of $\theta_b<\theta_b<\theta_d<\theta_e$ is established, and thus, the relation of $SL_1<SL_2<SL_3<SL_4<SL_5$, which defines the relation between the widths of the left-side shadow zones of the organic layers formed of the deposition material that has passed through the patterning slits 151 is also satisfied.

As described above, the organic layer deposition apparatus according to aspects of the present invention may be easily manufactured and may be simply applied to the manufacture of large-sized display devices on a mass scale. The organic layer deposition apparatus according to embodiments of the present invention improves the precision of moving a substrate, manufacturing yield, and deposition efficiency.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:
    fixing a substrate onto an electrostatic chuck;
    combining the electrostatic chuck with a chuck-moving member;
    moving the electrostatic chuck into a chamber by moving the chuck-moving member on a guide member; and
    forming an organic layer on the substrate by moving at least one of the substrate or an organic layer deposition assembly arranged in the chamber relative to the other,
    wherein the chuck-moving member is moved on the guide member by magnetic forces,
    wherein the substrate is spaced apart from the organic layer deposition assembly, and
    wherein a patterning slit sheet of the organic layer deposition assembly is smaller than the substrate in at least one of a first direction or a second direction perpendicular to the first direction,
    wherein the method comprises using an organic layer deposition apparatus comprising:
        a deposition source for discharging a deposition material;
        a deposition source nozzle unit arranged at a side of the deposition source and including a plurality of deposition source nozzles;
        the patterning slit sheet arranged opposite to the deposition source nozzle unit and including a plurality of patterning slits;
        the electrostatic chuck, the substrate being attachable to and detachable from the electrostatic chuck;
        the chuck-moving member combined with the electrostatic chuck and configured to move the electrostatic chuck;
        the guide member to guide movement of the chuck-moving, member; and
        a linear motion (LM) guide between the chuck-moving member and the guide member,
    wherein the chuck-moving member comprises a first magnetic three generator,
    wherein the guide member comprises a second magnetic force generator corresponding to the first magnetic force generator,
    wherein the chuck-moving member is movable on the guide member by magnetic forces between the first magnetic force generator and the second magnetic force generator,
    wherein the substrate is spaced apart from the patterning slit sheet, and at least one of the substrate or the patterning slit sheet is movable relative to the other,
    wherein the 1M guide comprises:
        a guide block on the chuck-moving member; and
        a guide rail on the guide member,
        wherein the guide block is movable on the guide rail.

2. The method of claim 1, wherein the organic layer deposition apparatus further comprises:
    a loading unit for attaching the substrate to the electrostatic chuck; and
    an unloading unit for detaching the substrate on which deposition has been performed from the electrostatic chuck.

3. The method of claim 1, wherein the deposition source nozzle unit comprises a plurality of deposition source nozzles arranged in a direction, and the plurality of patterning slits of the patterning slit sheet are arranged in another direction perpendicular to the direction.

4. The method of claim 1, wherein the first magnetic force generator comprises;
    a plurality of magnet rollers;
    a shaft connecting the plurality of magnet rollers; and a shaft fixing unit fixing the shaft onto the chuck-moving member to rotate the shaft about an axis extending along a lengthwise direction of the shaft.

5. The method of claim 4, wherein the second magnetic force generator comprises a magnet rail including a plurality of magnets on a surface of the guide member, the magnet rollers being spaced apart from the magnet rail.

6. The method of claim 4, wherein the plurality of magnet rollers comprises a plurality of magnets that are spirally twisted in the lengthwise direction of the shaft.

7. The method of claim 6, wherein, in the plurality of magnet rollers, adjacent magnets have different polarities.

8. The method of claim 5, wherein, in the magnet rail, the magnets are arranged in a line, and adjacent magnets of the plurality of magnets have different polarities.

9. The method of claim 5, wherein the plurality of magnets comprises electromagnets, permanent magnets, or superconductive magnets.

10. The method of claim 5, wherein the first magnetic force generator further comprises a driving unit for, rotating the shaft.

11. The method of claim 10, wherein the driving unit is on the chuck-moving member, and is moved together with the chuck-moving member on the guide member.

* * * * *